US009201995B2

(12) United States Patent
Setohara et al.

(10) Patent No.: US 9,201,995 B2
(45) Date of Patent: Dec. 1, 2015

(54) CIRCUIT DESIGN SUPPORT METHOD, COMPUTER PRODUCT, AND CIRCUIT DESIGN SUPPORT APPARATUS

(71) Applicant: SOCIONEXT INC., Yokohama-shi, Kanagawa (JP)

(72) Inventors: Yukinori Setohara, Kunitachi (JP); Shuji Hamada, Kawasaki (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 14/230,995

(22) Filed: Mar. 31, 2014

(65) Prior Publication Data

US 2014/0298279 A1    Oct. 2, 2014

(51) Int. Cl.
*G06F 17/50*    (2006.01)

(52) U.S. Cl.
CPC ........ *G06F 17/5045* (2013.01); *G06F 17/5022* (2013.01)

(58) Field of Classification Search
CPC ............ G06F 17/5045; G06F 17/5022; G06F 17/504; G06F 17/5036; G06F 17/5081
USPC .......................... 716/106, 100, 132, 135–136
See application file for complete search history.

(56) References Cited

U.S. PATENT DOCUMENTS

| 2002/0024352 A1* | 2/2002 | Sim ............................... 324/765 |
| 2005/0132254 A1 | 6/2005 | Shiota |

FOREIGN PATENT DOCUMENTS

| JP | 63-140969 | 6/1988 |
| JP | 3-296673 | 12/1991 |
| JP | 5-249197 | 9/1993 |
| JP | 2005-135226 | 5/2005 |

OTHER PUBLICATIONS

Patent Abstracts of Japan, Publication No. 2005-135226, Published May 26, 2005.
Patent Abstracts of Japan, Publication No. 05-249197, Published Sep. 28, 1993.
Patent Abstracts of Japan, Publication No. 03-296673, Published Dec. 27, 1991.
Patent Abstracts of Japan, Publication No. 63-140969, Published Jun. 13, 1988.

* cited by examiner

*Primary Examiner* — Stacy Whitmore
(74) *Attorney, Agent, or Firm* — Staas & Halsey LLP

(57) ABSTRACT

A circuit design support method includes obtaining shared circuit information indicating various types of shared circuits each executing at least any one of various types of logical computations and causing plural signal lines to share an observation point at which a signal value is observable; determining for each of the signal lines to be observed in a circuit under-design, a value based on controllability representing ease of control to set a value of the signal line to be a specific value; selecting based on the obtained shared circuit information, any one shared circuit among the various types of shared circuits; and generating correlation information that correlates each input terminal of the selected shared circuit with a signal line among the signal lines to be observed and whose value determined therefor is equal to a non-controlling value of a logical computation executed for an input signal input into the input terminal.

10 Claims, 27 Drawing Sheets

| TYPE | AREA |
|---|---|
| INV | 0.5 |
| BUF,NOR,NAND | 1.0 |
| OR,AND | 1.5 |
| EXOR | 2.5 |
| SFF | 8.0 |

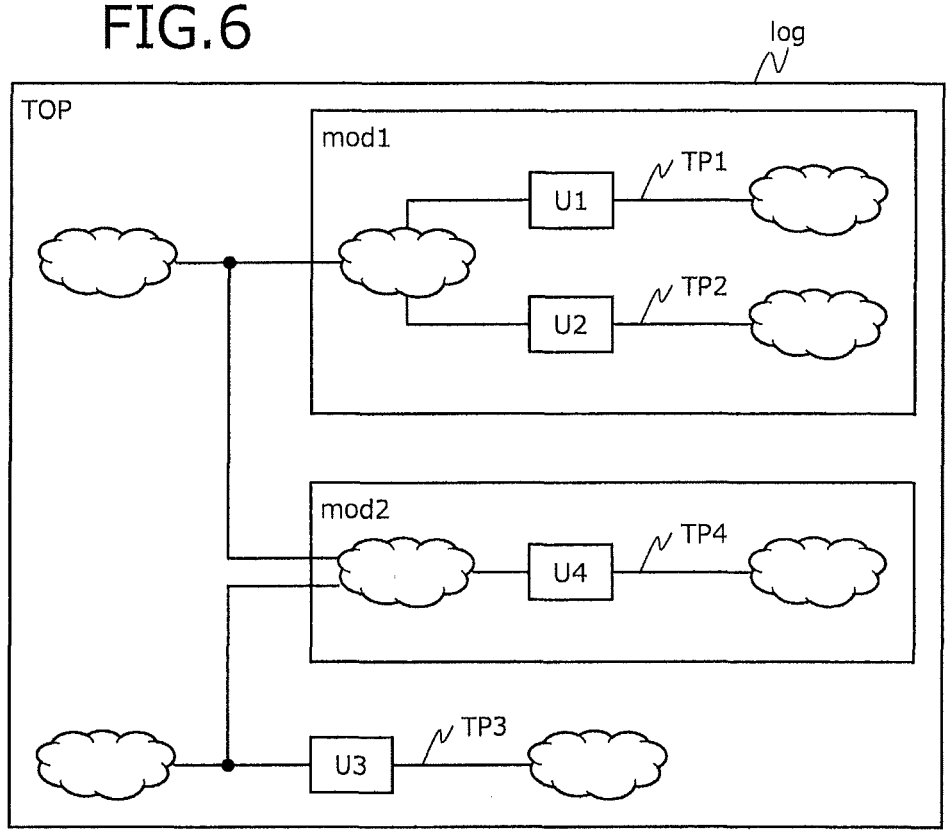

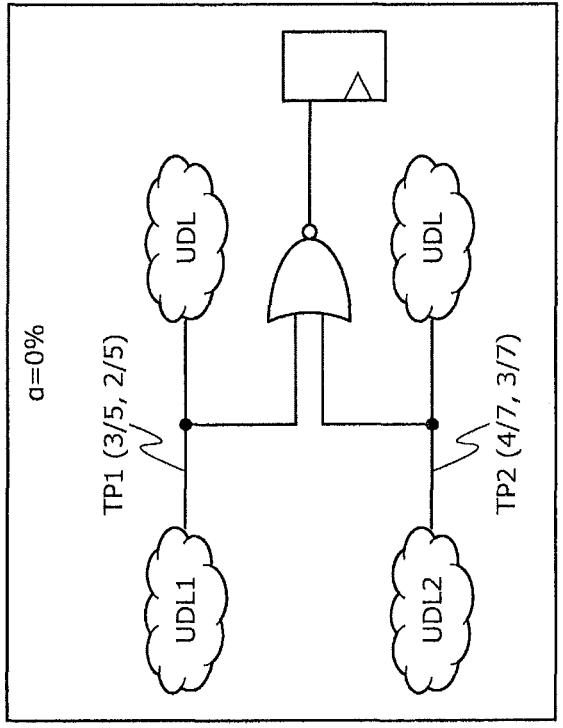
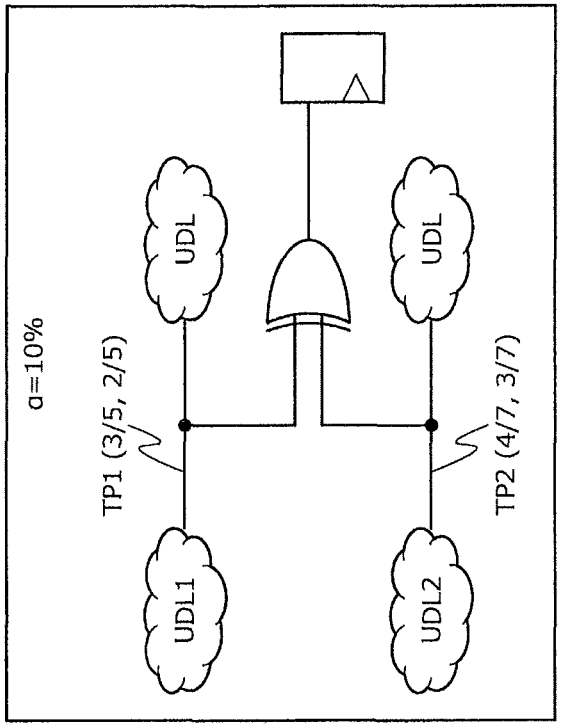

TP_obs = TP1 (TOP/mod1/U1/tp1, 0, 0, 0),
TP2 (TOP/mod1/U2/tp2, 1, 0, 0),
TP3 (TOP/U3/tp3, 0, 0, 1),
TP4 (TOP/mod2/U4/tp4, 0, 0, 0)

FIG.16

```
TP_obs = TP1 (TOP/mod1/U1/tp1, 0, 0, 0) ,
         TP2 (TOP/mod1/U2/tp2, 1, 0, 0) ,
         TP3 (TOP/U3/tp3, 0, 0, 1) ,
         TP4 (TOP/mod2/U4/tp4, 0, 0, 2)
```

| SHARED CIRCUIT NAME | INPUT TERMINAL NAME | CANDIDATE TP NAME |
|---|---|---|
| 3-INPUT NOR CIRCUIT | 1 | TP1 |
| | 2 | TP3 |
| | 3 | TP4 |

FIG.19

TP_obs = TP2 (TOP/mod1/U2/tp2, 1, 0, 0),
SP1 (TOP/mod1/U1/sp1, 1, 0, 1)

| SHARED CIRCUIT NAME | INPUT TERMINAL NAME | CANDIDATE TP NAME |
|---|---|---|
| 2-INPUT NAND CIRCUIT | 1 | TP2 |
| | 2 | SP1 |

FIG.22

TP_obs = SP2 (TOP/mod1/U1/sp2, 0, 0, 2)

FIG.23

SP = SP2 (TOP/mod1/U1/sp2, 0, 0, 2)

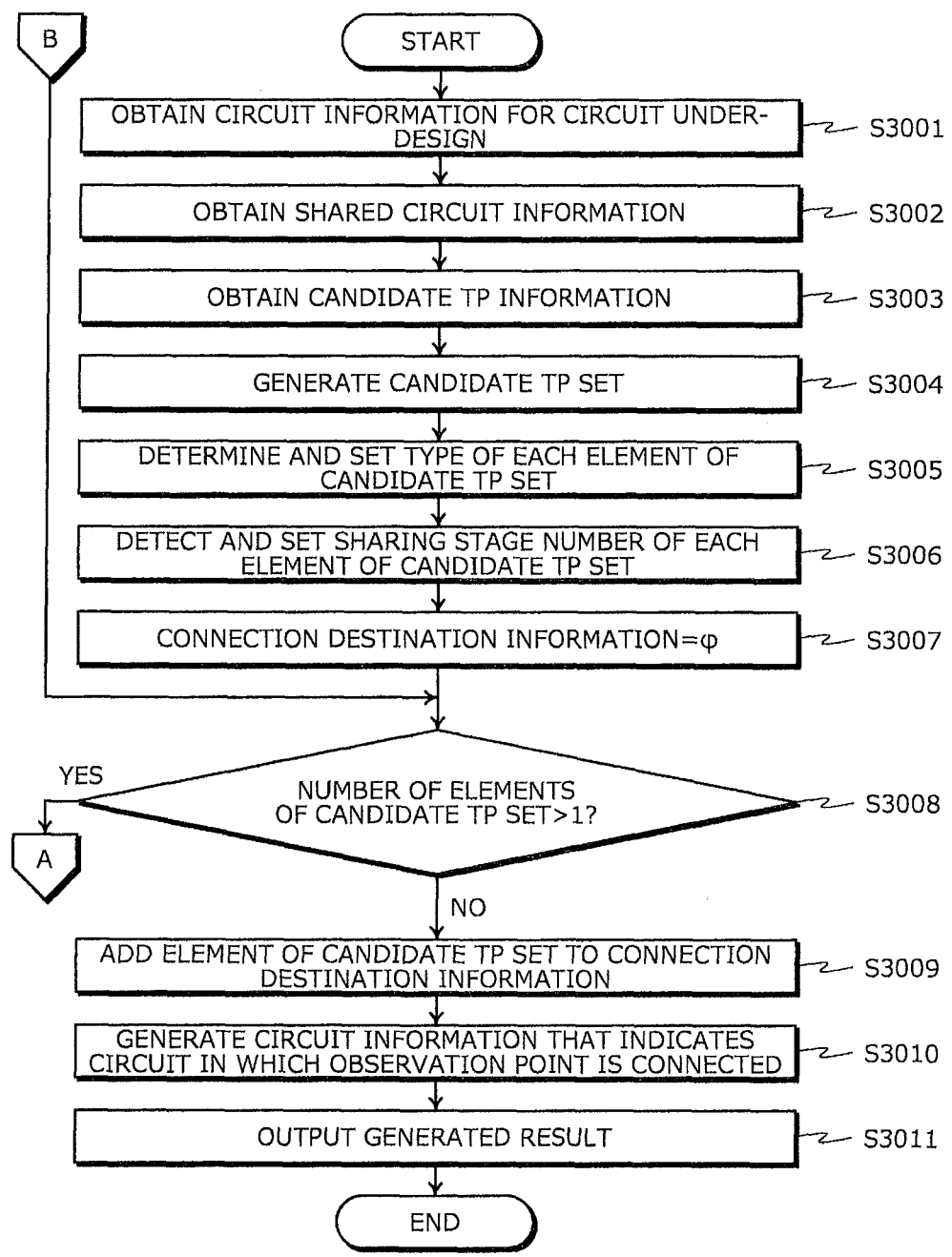

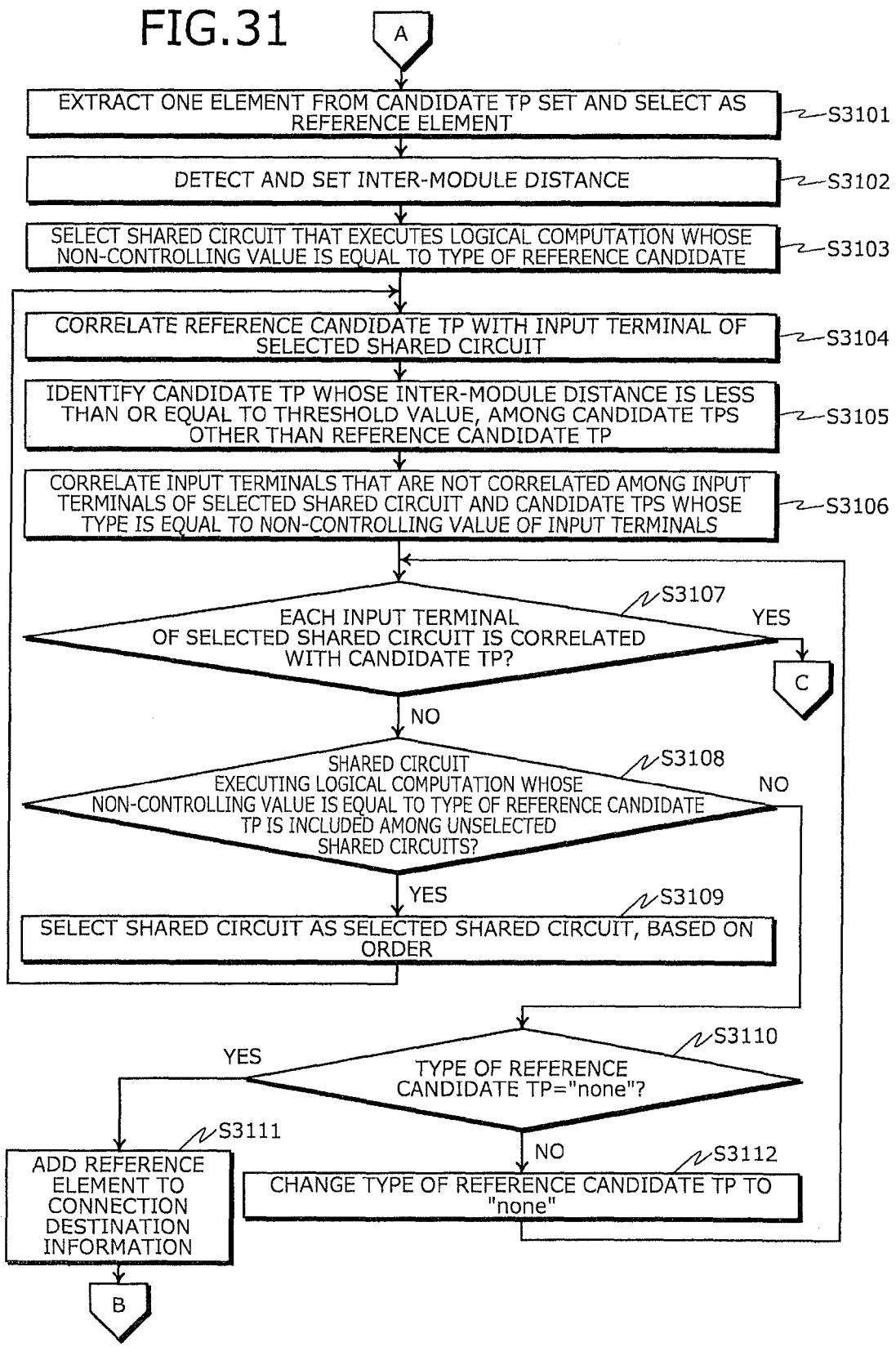

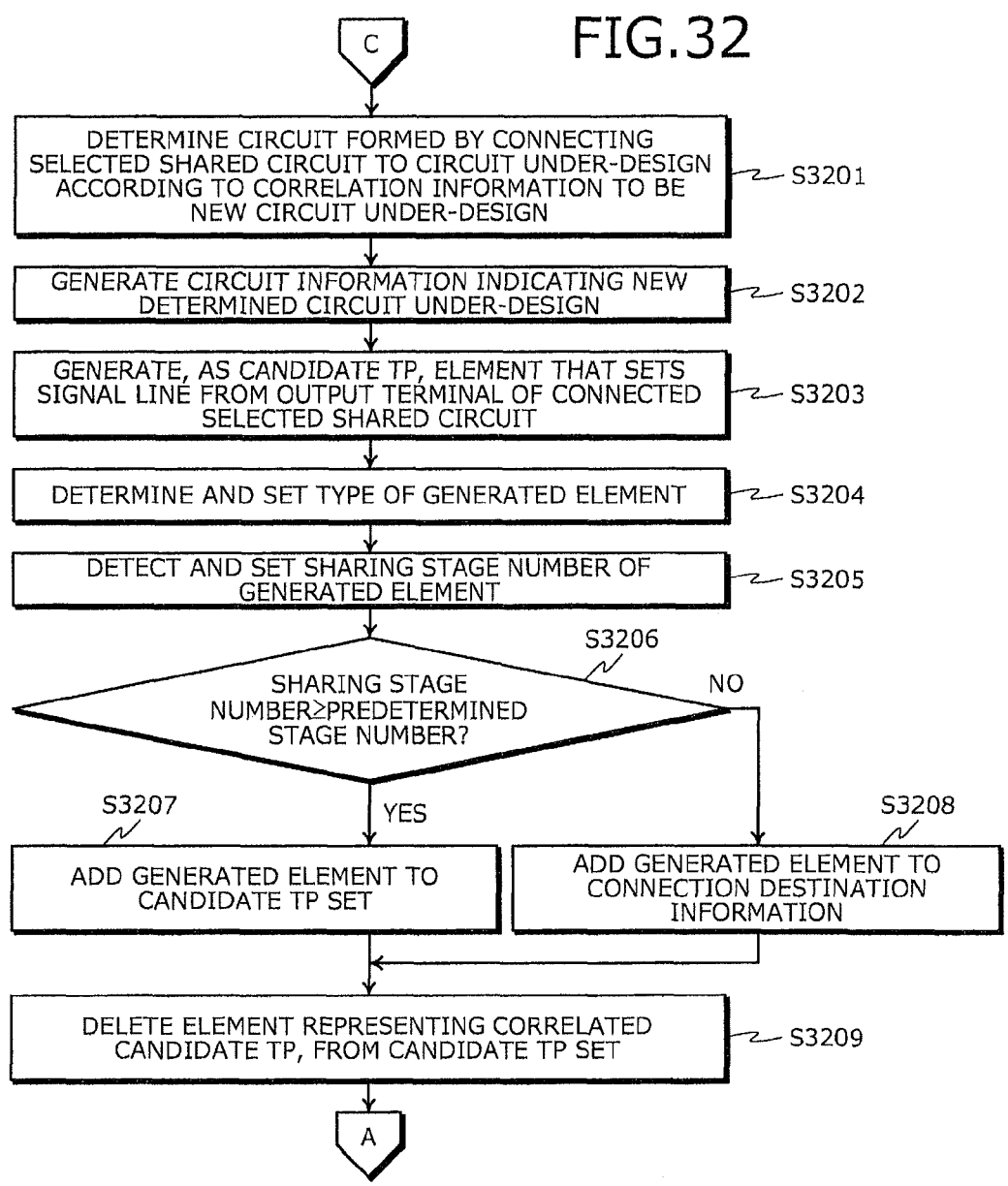

CIRCUIT DESIGN SUPPORT METHOD, COMPUTER PRODUCT, AND CIRCUIT DESIGN SUPPORT APPARATUS

CROSS REFERENCE TO RELATED APPLICATIONS

This application is based upon and claims the benefit of priority of the prior Japanese Patent Application No. 2013-077154, filed on Apr. 2, 2013, the entire contents of which are incorporated herein by reference.

FIELD

The embodiment discussed herein is related to a circuit design support method, a computer product, and a circuit design support apparatus.

BACKGROUND

According to a conventionally known technique referred to as "test point insertion (TPI)", a mechanism to observe and control a value of a signal line is inserted in a semiconductor integrated circuit to improve the fault detection rate during a test of the semiconductor circuit.

For example, when a combinational circuit to detect faults is connected to an external terminal or a scan flip flop (hereinafter, referred to as "SFF") through another combinational circuit, the fault detection rate of the combinational circuit that detects faults decreases consequent to the influence of the other combinational circuit. Therefore, according to a known technique for the TPI, an observation point such as an SFF or an output terminal is connected to the signal line between the combinational circuit that detects faults and the other combination circuit; whereby, observation of the value of the signal line is enabled and the fault detection rate is improved.

When many observation points are present, the circuit area of the semiconductor integrated circuit and the number of output terminals increases. Therefore, according to a conventionally known technique, an exclusive OR circuit whose input terminals are connected to plural signal lines that are to be observed causes the plural signal lines to share an observation point, whereby increases in the circuit area and the number of output terminals is suppressed (see, e.g., Japanese Laid-Open Patent Publication Nos. 2005-135226, H5-249197, H3-296673, and S63-140969).

However, the exclusive OR circuit has a large area and therefore, when an exclusive OR circuit is used as a shared circuit that causes the plural signal lines to share the observation point, the area necessary for the shared circuit becomes large.

SUMMARY

According to an aspect of an embodiment, a circuit design support method includes obtaining shared circuit information indicating various types of shared circuits each executing at least any one of various types of logical computations and causing plural signal lines to share thereamong an observation point at which a signal value is observable; determining for each of the signal lines to be observed in a circuit under-design, a value based on controllability representing ease of control to set a value of the signal line to be a specific value; selecting based on the obtained shared circuit information, any one shared circuit among the various types of shared circuits; and generating correlation information that correlates each input terminal of the selected shared circuit with a signal line among the signal lines to be observed and whose value determined therefor is equal to a non-controlling value of a logical computation executed for an input signal input into the input terminal. The circuit design support method is executed by a computer.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 is an explanatory diagram of an example of a circuit under-design;

FIG. 7 is an explanatory diagram of an example of candidate TP information;

FIG. 8 is an explanatory diagram of an example of generation of a candidate TP set;

FIGS. 11A and 11B are explanatory diagrams for an example of comparison of cases where "α" is zero [%] and where "α" is 10 [%];

FIG. 16 is an explanatory diagram of an example of the candidate TP set obtained after setting of the inter-module distance;

FIG. 17 is an explanatory diagram of an example of correlation information 1;

FIG. 19 is an explanatory diagram of an example of a new candidate TP set 1;

FIG. 20 is an explanatory diagram of an example of correlation information 2;

FIG. 22 is an explanatory diagram of an example of a new candidate TP set 2;

FIG. 23 is an explanatory diagram of an example of connection destination information;

FIGS. 30, 31, and 32 are flowcharts of an example of a procedure for a design support process executed by the circuit design support apparatus according to a first example;

DESCRIPTION OF EMBODIMENTS

Embodiments of a circuit design support method, a circuit design support program, and a circuit design support apparatus will be described in detail with reference to the accompanying drawings.

Figure 1:
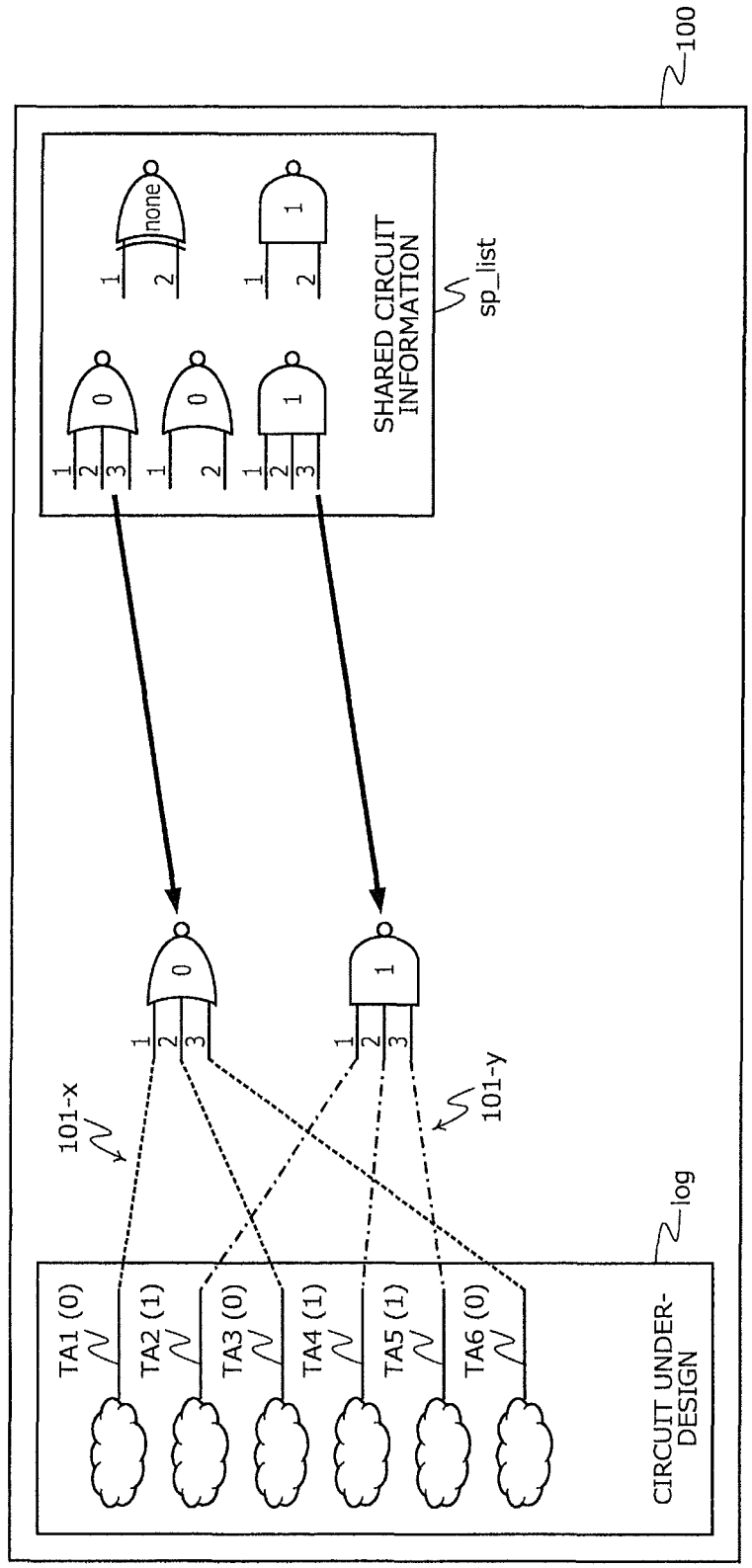
FIG. 1 is an explanatory diagram of an example of an operation executed by a circuit design support apparatus.

FIG. 1 is an explanatory diagram of an example of an operation executed by the circuit design support apparatus. A circuit design support apparatus 100 is a computer that supports the design of a circuit under-design "log"; is a shared circuit that causes plural signal lines to share an observation point at which a signal value is observable; and obtains shared circuit information sp_list that indicates various types of shared circuits each executing at least any one among various types of logical operations. In the example depicted in FIG. 1, the various types of shared circuits include, for example, a two-input exclusive OR (hereinafter, referred to as "EXOR") circuit and shared circuits whose areas can each be reduced to a greater extent than that of the two-input EXOR circuit. As shared circuits whose areas can be reduced to a greater extent than that of the EXOR circuit, in the example depicted in FIG. 1, a two-input negative AND (hereinafter, referred to as "NAND") circuit, a three-input NAND circuit, a two-input negative OR (hereinafter, referred to as "NOR") circuit, and a three-input NOR circuit are presented. A "circuit whose area can be reduced" is a circuit whose area for one input terminal is less than that of the EXOR circuit, the area for one input terminal being a value obtained by dividing the circuit area by the number of input terminals. The details of the shared circuit will be described later.

The circuit design support apparatus 100 determines for each of the signal lines to be observed in the circuit under-design "log", a value based on controllability that represents the ease of control to set the value of the signal line to be a specific value. In the example depicted in FIG. 1, the signal lines to be observed are denoted by TA1 to TA6.

Controllability such as that representing the ease of control to set the value of the signal line to be "0" is referred to as "0-controllability". Controllability such as that representing the ease of control to set the value of the signal line to be "1" is referred to as "1-controllability". For example, the 0- and the 1-controllability are represented respectively by, for example, a probability. The calculation method for the 0- and the 1-controllability will be described later. The value determined for the signal line is a non-controlling value of the logical computation executed by the shared circuit that has input terminals correlated with the signal lines. The "non-controlling value" is a value that does not determine the computation result of the logical computation. For example, the non-controlling values of a logical product (hereinafter, referred to as "AND") and NAND are respectively "1"; the non-controlling values of OR and NOR are respectively "0"; and the non-controlling value of EXOR is none (not present). In FIG. 1, "0", "1", or "none" appended to the shared circuits indicated by the shared circuit information sp_list represents a non-controlling value. The result of the determination is depicted in ( ) after the identification information of each signal line. For example, "0" of the signal line TA1(0) is the determined value.

The circuit design support apparatus 100 selects any one shared circuit from the various types of shared circuits, based on the obtained shared circuit information sp_list; and generates correlation information 101 that correlates each input terminal of the selected shared circuit with a signal line whose determined value is equal to the non-controlling value of the logical computation executed for the input signal input into the input terminal, among the signal lines TA1 to TA6 to be observed. The correlation information 101 includes, for example, identification information concerning the selected shared circuit, identification information concerning the input terminal of the shared circuit, and the identification information concerning the signal line.

For example, when the three-input NOR circuit is selected, the signal lines TA1, TA3, and TA6 whose determined values are each "0" are correlated with the input terminals of the three-input NOR circuit. The correlation information 101 for the three-input NOR circuit depicted in FIG. 1 is correlation information 101-$x$.

For example, when the three-input NAND circuit is selected, the signal lines TA2, TA4, and TA5 whose determined values are each "1" are correlated with the input terminals of the three-input NAND circuit. The correlation information 101 for the three-input NAND circuit in FIG. 1 is correlation information 101-$y$.

As depicted in FIG. 1, the circuit design support apparatus 100 correlates each input terminal of the shared circuit selected from among the various types of shared circuits that include types of shared circuits whose areas can be reduced to a greater extent than that of the EXOR circuit, with the signal line whose value based on controllability is equal to the non-controlling value of the circuit computation. Thereby, a reduction of the area necessary for the shared circuit is facilitated within a range for the value of the signal line to be observable.

Figures 2, 3:
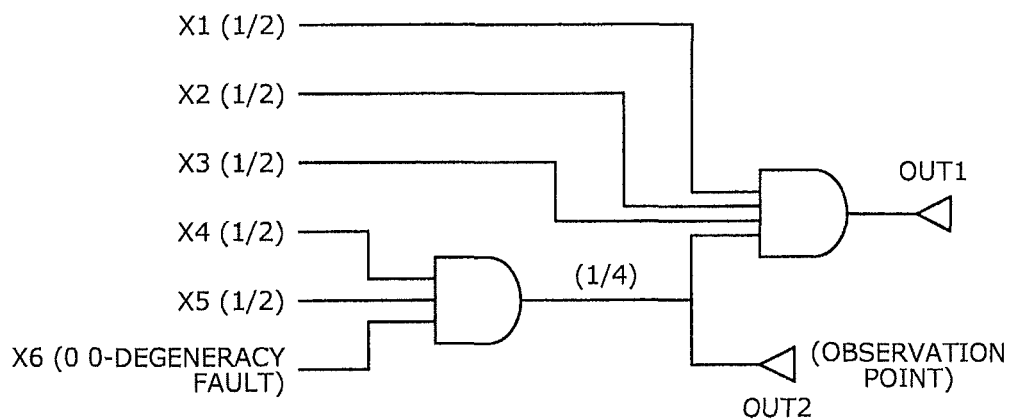
FIG. 2 is an explanatory diagram of an example of an observation point.
FIG. 3 is an explanatory diagram of examples of cell types and examples of cell areas.

FIG. 2 is an explanatory diagram of an example of an observation point. An "observation point" will briefly be described. An observation point is a mechanism to observe the signal value and is, for example, an external output terminal or an SFF. The observation of the signal value at the observation point is enabled by connecting the observation point to a signal line by which the signal value tends not to reach an external output terminal or a scan flip flop (hereinafter, referred to as "SFF").

An example will be taken where, assuming that a 0-degeneracy fault occurs in a signal line for an input signal X6 in a six-input AND circuit formed by a four-input AND circuit and a three-input AND circuit, the fault is observed at an output terminal OUT1. To observe the 0-degeneracy fault of the input signal X6, the input values of input signals X1 to X5 all need to be "1". Assuming that the probability for each of the input signals X1 to X5 to be "1" is ½, the probability for all of the input signals X1 to X5 to be "1" is 1/32 (=1/($2^5$)). Therefore, the probability for the 0-degeneracy fault of the input signal X6 to be observable at the output terminal is 1/32. Values depicted in parentheses in FIG. 2 each represent the probability for the signal line to be "1".

In a case where the three-input AND circuit is connected to an observation point such as an output terminal OUT2, the 0-degeneracy fault assumed to occur in the input signal X6 is observable at the output terminal OUT2 when the input signals X4 and X5 are each "1". The probability for each of the input signals X4 and X5 to be "1" is ½ and therefore, the probability for both of the input signals X4 and X5 to be "1" is ¼ (=1/($2^2$)). Therefore, the probability for the 0-degeneracy fault of the input signal X6 to be observable at the output terminal OUT2 is ¼.

As described, the connection of the observation point improves the probability for the 0-degeneracy fault assumed to occur in the input signal X6 to be observable.

FIG. 3 is an explanatory diagram of examples of cell types and examples of cell areas. The circuit names depicted in FIG. 3 each represent one cell. The areas are all equal in the layout of a buffer (hereinafter, referred to as "BUF") circuit, the two-input NOR circuit, and the two-input NAND circuit. FIG. 3 depicts the outline of the areas of the other logic circuits obtained when it is assumed that the areas in the layout of the BUF circuit, the two-input NOR circuit, and the two-input NAND circuit are each "1.0". The area of an inverter circuit (INV) is "0.5", those of the two-input OR circuit and the two-input AND circuit are each "1.5", that of the two-input EXOR circuit is "2.5", and that of the SFF is "8.0". As depicted in FIG. 3, when the two-input EXOR circuit is used as the shared circuit, the area thereof is larger than that of the case where the two-input NAND circuit or the two-input NOR circuit is used as the shared circuit.

Figure 4:
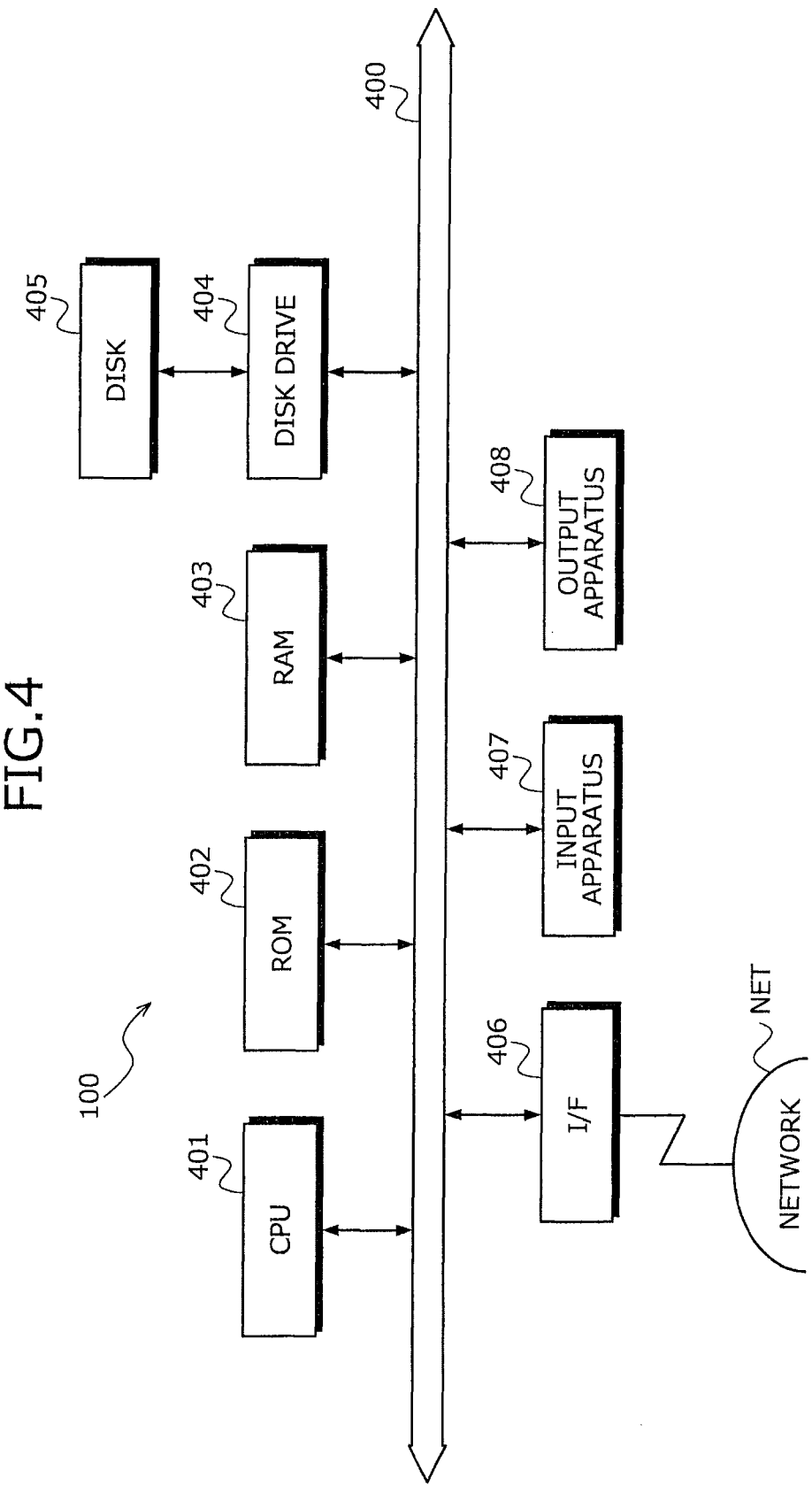
FIG. 4 is a block diagram of a hardware configuration example of the circuit design support apparatus.

FIG. 4 is a block diagram of a hardware configuration example of the circuit design support apparatus. The circuit design support apparatus 100 includes a CPU 401, read-only memory (ROM) 402, random access memory (RAM) 403, a disk drive 404, a disk 405, an interface (I/F) 406, an input apparatus 407, and an output apparatus 408, respectively connected by a bus 400.

Here, the CPU 401 governs overall control of the circuit design support apparatus 100. The ROM 402 stores programs such as a boot program. The RAM 403 is a storage unit that is used as a work area of the CPU 401. The disk drive 404, under the control of the CPU 401, controls the reading and writing of data with respect to the disk 405. The disk 405 stores data written thereto under the control of the disk drive 404. A magnetic disk, an optical disk, and the like may be given as examples of the disk 405.

The I/F 406 is connected, via a communication line, to a network NET such as a local area network (LAN), a wide area network (WAN) and the Internet, and is connected to other apparatuses through the network NET. The I/F 406 administers an internal interface with the network NET and controls the input and output of data with respect to external apparatuses. A modem, a LAN adapter, and the like may be adopted as the I/F 406.

The input apparatus 407 is an interface for the input of various types of data via user operation of a keyboard, a mouse, a touch panel, and the like. The input apparatus 407 is further capable of taking in images and moving pictures from a camera as well as audio from a microphone. The output apparatus 408 is an interface that according to an instruction from the CPU 401, outputs data. Examples of the output apparatus 408 may include a display, a printer, and the like.

Figure 5:
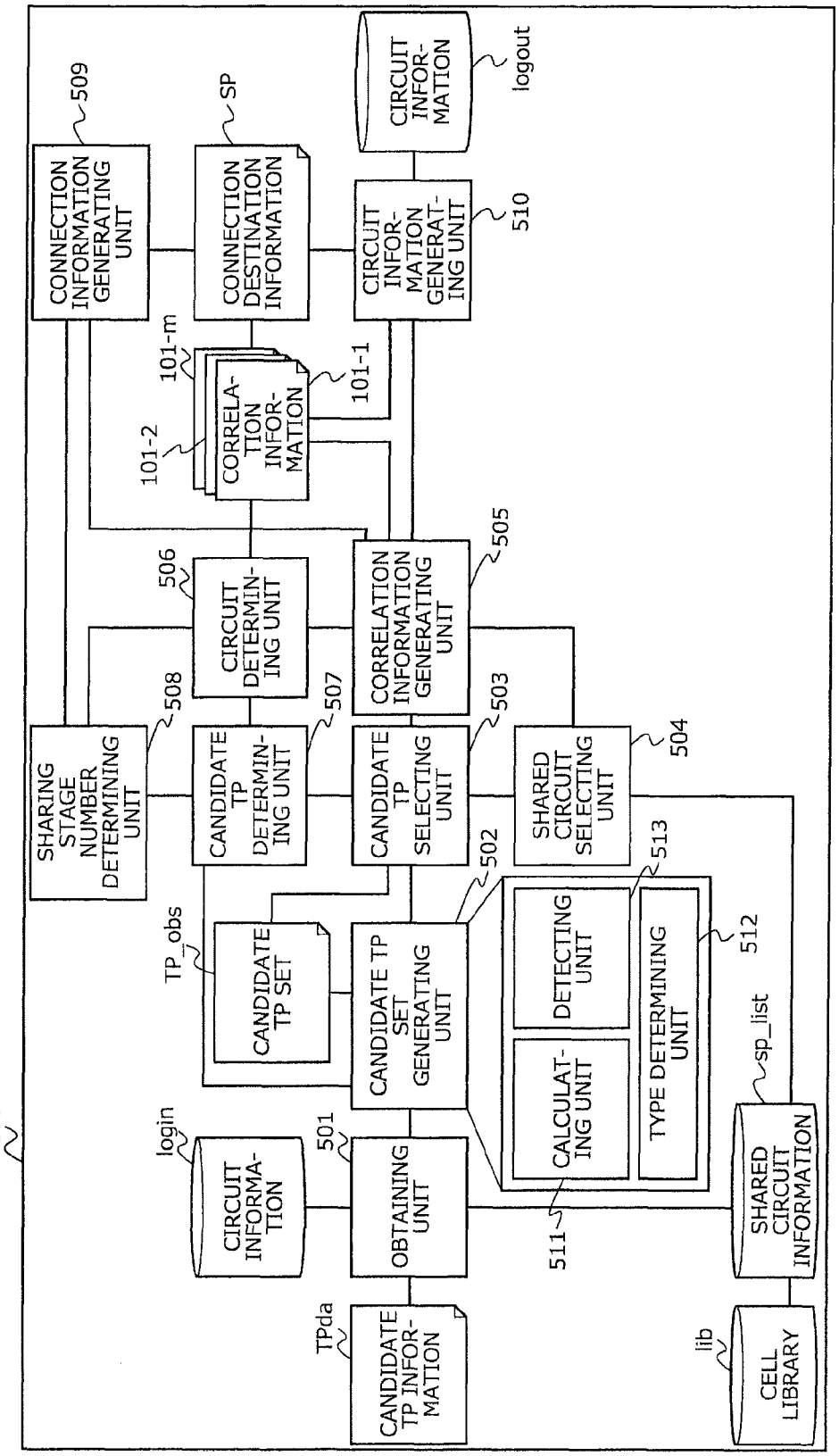
FIG. 5 is a block diagram of a functional configuration example of the circuit design support apparatus.

FIG. 5 is a block diagram of a functional configuration example of the circuit design support apparatus. The circuit design support apparatus 100 includes an obtaining unit 501, a candidate TP set generating unit 502, a candidate TP selecting unit 503, a shared circuit selecting unit 504, and a correlation information generating unit 505; and further includes a circuit determining unit 506, a candidate TP determining unit 507, a sharing stage number determining unit 508, a connection information generating unit 509, and a circuit information generating unit 510.

Processes of the obtaining unit 501 to the circuit information generating unit 510 are, for example, coded in a design support program stored in a storage apparatus such as the disk 405, which can be accessed by the CPU 401. The CPU 401 reads the design support program stored in the storage apparatus and executes the processes coded in the design support program. Thereby, the processes of the obtaining unit 501 to the circuit information generating unit 510 are implemented. The processing results are, for example, stored to the storage apparatus such as the disk 405.

The obtaining unit 501 obtains circuit information "login" that indicates the connection relation among cells in the circuit under-design "log". The circuit information "login" is a network list and is described in a system description language or a hardware description language such as Verilog or a very high speed integrated circuit hardware description language (VHDL).

FIG. 6 is an explanatory diagram of an example of the circuit under-design. Modules in the circuit under-design "log" will briefly be described. The modules TOP representing the overall circuit under-design "log" includes modules mod1 and mod2, a unit U3, etc. The module mod1 includes units U1 and U2, etc. The module mod2 includes a unit U4, etc. One or more cell(s) such as a combinational circuit or a sequential circuit will be referred to as "unit". The signal lines to be observed in the circuit under-design "log" will each be referred to as "candidate test point (TP)". In the example depicted in FIG. 6, candidate TPs are TP1 to TP4.

The obtaining unit 501 obtains candidate TP information TPda that indicates plural candidate TPs to be observed in the circuit under-design "log". The candidate TP information TPda is, for example, a network name of a network that includes an absolute path from a module that represents the overall circuit under-design "log" to a module that includes the candidate TP, included in the circuit information "login".

FIG. 7 is an explanatory diagram of an example of candidate TP information. The candidate TP information TPda based on the circuit under-design "log" depicted in FIG. 7 will be described. The candidate TP information TPda has a field for the candidate TP name. Setting information in the candidate TP name field causes the information to be registered as a record. The candidate TP information TPda is realized by, for example, the storage apparatus such as the disk 405. The candidate TP name field has information that indicates the name of each module that includes the candidate TP, the name of a unit connected to the candidate TP, and the candidate TP name, respectively connected by "/" therebetween.

The candidate TP set generating unit 502 generates based on the candidate TP information TPda, a candidate TP set TP_obs that includes, as one element, the candidate TP name "Name", the type "type", the sharing stage number "Depth", and the inter-module distance "Distance" (hereinafter, abbreviated as "Dist"). Each element represents a candidate TP. The type "type" is a value determined based on the controllability for the candidate TP. The determined value is the non-controlling value of the logical computation executed by the shared circuit including the input terminal correlated with the candidate TP. The sharing stage number "Depth" represents the number of stages of the shared circuits to propagate the signal propagated by the candidate TP and the initial value thereof is "0". The inter-module distance "Dist" represents the number of modules in the circuit under-design "log" present between the modules in the circuit under-design "log" that includes the two candidate TPs, and the initial value thereof is "0". The candidate TP set generating unit 502 stores the generated candidate TP set TP_obs to the storage apparatus such as the RAM 403 or the disk 405.

FIG. 8 is an explanatory diagram of an example of generation of the candidate TP set. In the parentheses immediately after TPn (in FIGS. 8, n=1 to 4), which is an element of the candidate TP set TP_obs, the candidate TP name "Name", the type "type", the sharing stage number "Depth", and the inter-module distance "Dist" are sequentially indicated. An initial value is set for each of the type "type, the sharing stage number Depth, and the inter-module distance Dist.

The candidate TP set generating unit 502 includes a calculating unit 511, a detecting unit 513, and a type determining unit 512. The calculating unit 511 calculates the 0-controllability and the 1-controllability for the candidates TP represented by the elements of the candidate TP set TP_obs.

Figure 9:
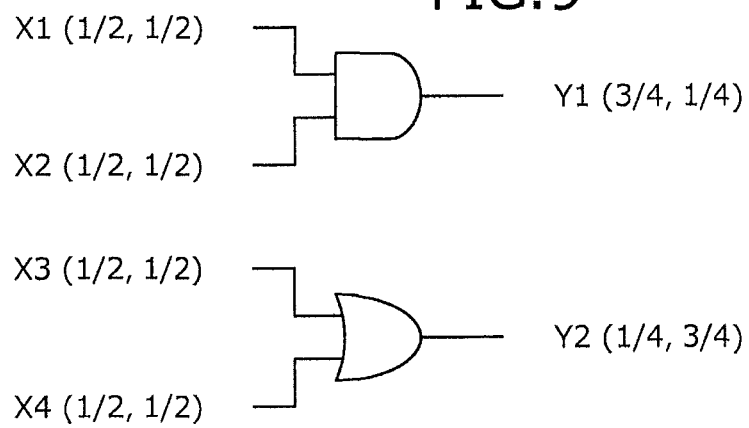
FIG. 9 is an explanatory diagram of a calculation example of controllability.

FIG. 9 is an explanatory diagram of a calculation example of the controllability. For example, the circuit design support apparatus 100 calculates the 1-controllability of the two-input AND circuit by calculating the product of the 1-controllability of the inputs; and calculates the 0-controllability of the two-input AND circuit by subtracting the 1-controllability from one. For the two-input AND circuit as depicted in FIG. 9, the 1-controllability of a signal line Y1 from the output terminal of the two-input AND circuit is $1/4$ ($=1/2 \times 1/2$); and the 0-controllability of the signal line Y1 from the output terminal of the two-input AND circuit is $3/4$ ($1-(1/2 \times 1/2)$).

For example, the calculating unit 511 calculates the 0-controllability of the two-input OR circuit by calculating the product of the 0-controllability of the inputs; and calculates the 1-controllability of the two-input OR circuit by subtracting the 0-controllability from one. For the two-input OR circuit as depicted in FIG. 9, the 0-controllability of a signal line Y2 from the output terminal of the two-input OR circuit is $1/4$ ($=1/2 \times 1/2$); and the 1-controllability of the signal line Y2 from the output terminal of the two-input OR circuit is $3/4$ ($1-(1/2 \times 1/2)$).

The type determining unit 512 determines the value, based on the result of the calculation by the calculating unit 511 for each of the plural candidate TPs indicated by the candidate TP information TPda. The "value determined for the candidate TP" is a non-controlling value of the logical computation executed by the shared circuit that includes the input terminal correlated with the candidate TP. The "non-controlling value" is a value that does not determine the result of the logical computation. For example, the non-controlling value for each of AND and NAND is "1"; that for each of OR and NOR is "0"; and that for EXOR is "none" (not present). As described, the value based on the calculation result is represented by the type "type" of the shared circuit to be assigned to a candidate TP.

Figure 10:
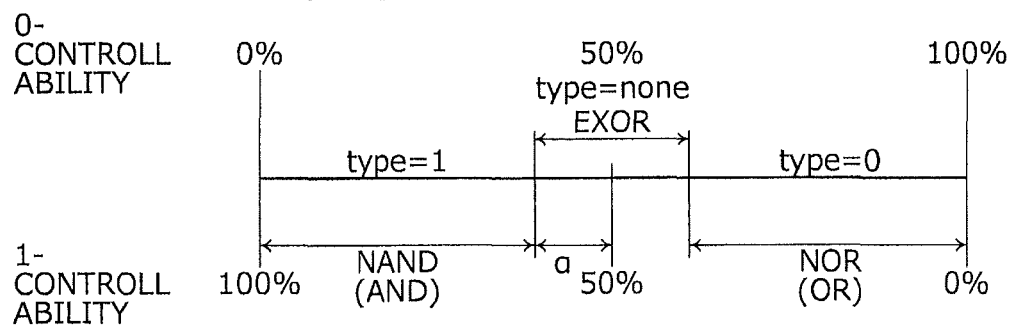
FIG. 10 is an explanatory diagram of an example of a determination method of the type of each candidate TP.

FIG. 10 is an explanatory diagram of an example of a determination method of the type of each candidate TP. For a candidate TP whose 0-controllability is close to zero or whose 1-controllability is close to one, the type determining unit 512 determines that the type "type" of the candidate TP is one. The expression "the 0-controllability is close to zero or the 1-controllability is close to one" means, for example, a case where a condition "0-controllability+α<1-controllability" is satisfied. For example, when the type "type" is determined as "1", as depicted in FIG. 10, a shared circuit executing NAND or AND is assigned to the candidate TP with priority compared to a shared circuit executing EXOR.

For a candidate TP whose 0-controllability is close to one or whose 1-controllability is close to zero, the type determining unit 512 determines that the type "type" of the candidate TP is zero. The expression "the 0-controllability is close to one or the 1-controllability is close to zero" means, for example, a case where a condition "0-controllability>1-controllability+α" is satisfied. For example, when the type "type" of the candidate TP is determined as "0", as depicted in FIG. 10, a shared circuit executing NOR or OR is assigned to the candidate TP with priority compared to a shared circuit executing EXOR.

For a signal line whose 0-controllability is close to 0.5 or whose 1-controllability is close to 0.5, the type determining unit 512 determines that the type "type" of the candidate TP is none. The expression "the 0-controllability is close to 0.5 or the 1-controllability is close to 0.5" means, for example, a case where a condition "α≥|1-controllability−0-controllability|" is satisfied. For example, when the type "type" of the candidate TP is determined as "none", as depicted in FIG. 10, a shared circuit executing EXOR is assigned to the candidate TP.

"α" represents a margin provided for the condition to determine the type "type" of the candidate TP. For example, in a case where a design engineer or a verification engineer for the circuit under-design "log" generates a test pattern of the circuit under-design "log", if the controllability is low, there is a possibility that the signal value of the candidate TP will not be designed to be an intended value. Therefore, in a case where the controllability is low, when (as the shared circuit) a logical circuit is used that executes the logical computation whose non-controlling value is "1" or "0" such as AND, NAND, OR, or NOR, the fault may not be propagated to the observation point. Therefore, a logical circuit executing the logical computation whose non-controlling value is "none" such as NOR is used as the shared circuit such that, in the case where the controllability is low, even when a degeneracy fault of either "0" or "1" occurs, the fault can be propagated.

FIGS. 11A and 11B are explanatory diagrams for an example of comparison of cases where "α" is zero [%] and where "α" is 10[%]. The 0-controllability and the 1-controllability are indicated in this order in the parentheses after each candidate TP TPn. For example, the 0-controllability of the candidate TP TP1 is $3/5$ and the 1-controllability of the candidate TP TP1 is $2/5$. For example, the 0-controllability of the candidate TP TP2 is $4/7$ and the 1-controllability of the candidate TP TP2 is $3/7$.

When "α" is zero [%], for both of the candidate TPs TP1 and TP2, the 0-controllability>the 1-controllability is established and the circuit design support apparatus 100 determines that the type "type" of each of the candidate TPs TP1 and TP2 is "0". When "α" is 10[%], for both of the candidate TPs TP1 and TP2, "α≥| the 1-controllability−the 0-controllability" is established and the circuit design support apparatus 100 determines that the type "type" of each of the candidate TPs TP1 and TP2 is "none".

Figures 12, 13:
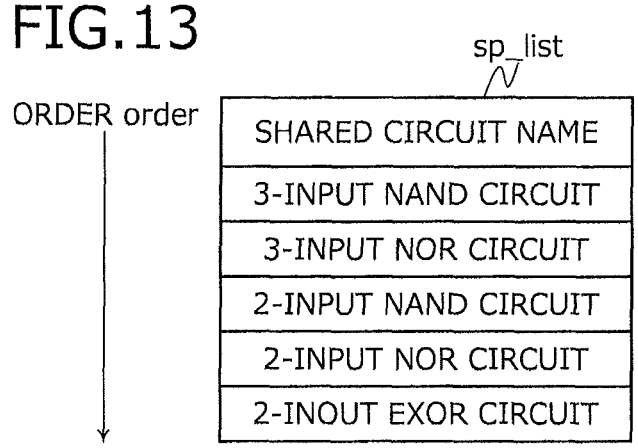
FIG. 12 is an explanatory diagram of an example where the types are set in a candidate TP set.
FIG. 13 is an explanatory diagram of an example of shared circuit information.

FIG. 12 is an explanatory diagram of an example where the types are set in the candidate TP set. "0", "1", "0", and "0" are respectively set as the types "type" of the elements representing the candidate TPs TP1 to TP4.

The obtaining unit 501 obtains the shared circuit information sp_list that indicates the various types of shared circuits respectively causing the plural candidate TPs to share the observation point at which the signal value is observable. The shared circuit information sp_list indicates the order of the various types of shared circuit, based on the area and the number of input terminals of each of the various types of shared circuits. The order is, for example, in descending order of the area reduction effect.

FIG. 13 is an explanatory diagram of an example of the shared circuit information. The shared circuit information sp_list stores the shared circuit names, based on the descending order of the area reduction effect "order". FIG. 13 depicts the shared circuits that respectively execute one type of logical computation such as NAND, NOR, or EXOR. An AND-NOR complex gate formed by combining an AND circuit and a NOR circuit or an OR-NAND complex gate formed by combining an OR circuit and a NAND circuit, may be used as the shared circuit.

The "descending order of the area reduction effect "order" is the ascending order of the area per one input terminal "order". The order "order" is "a complex gate>a NAND or a NOR circuit including three or more inputs>a two-input NAND or a two-input NOR circuit>an EXOR circuit". For example, the area of a three-input NAND circuit is larger than that of a two-input NAND circuit while the area per one input terminal of the three-input NAND circuit is smaller than that of the two-input NAND circuit. Therefore, the area reduction effect of the three-input NAND circuit is higher than that of the two-input NAND circuit.

The shared circuits may include an independent AND circuit whose area reduction effect is higher than that of the EXOR circuit. The "independent AND circuit" means an AND circuit that alone forms a cell. For the AND circuit and the NAND circuit, the non-controlling values thereof are equal to each other and, when the number of input terminals thereof is also equal to each other, the NAND circuit has a smaller area than that of the AND circuit. Therefore, the NAND circuit is used preferentially as the shared circuit as compared to the AND circuit.

The shared circuits may include an independent OR circuit whose area reduction effect is higher than that of the EXOR circuit. The "independent OR circuit" means an OR circuit that alone forms a cell. For the OR circuit and the NOR circuit, the non-controlling values thereof are equal to each other and, when the number of input terminals thereof is also equal to each other, the NOR circuit has a smaller area than that of the OR circuit. Therefore, the NOR circuit is used as the shared circuit with priority compared to the OR circuit.

In a first example, a shared circuit is selected that executes computation whose non-controlling value is equal to the value based on the controllability of the selected signal line to be observed, from the various types of shared circuits including a type thereof that can reduce the area to a greater extent than the EXOR circuit. Thereby, the area that is necessary for the shared circuit is reduced within a range for the value of the signal line to be observable.

The candidate TP selecting unit 503 selects one candidate TP from the plural candidate TPs. For example, the candidate TP selecting unit 503 selects one element from the elements included in the candidate TP set. The selected element will be denoted by "tp" and the candidate TP represented by the element "tp" will be referred to as "reference candidate TP".

For each of the candidate TPs other than the reference candidate TP among the plural candidate TPs, the detecting unit 513 detects the inter-module distance "Dist" between a module in the circuit under-design "log" that includes another candidate TP and a module in the circuit under-design "log" that includes the reference candidate TP. The detecting unit 513 sets the detection result as the inter-module distance Dist.

Figure 14:
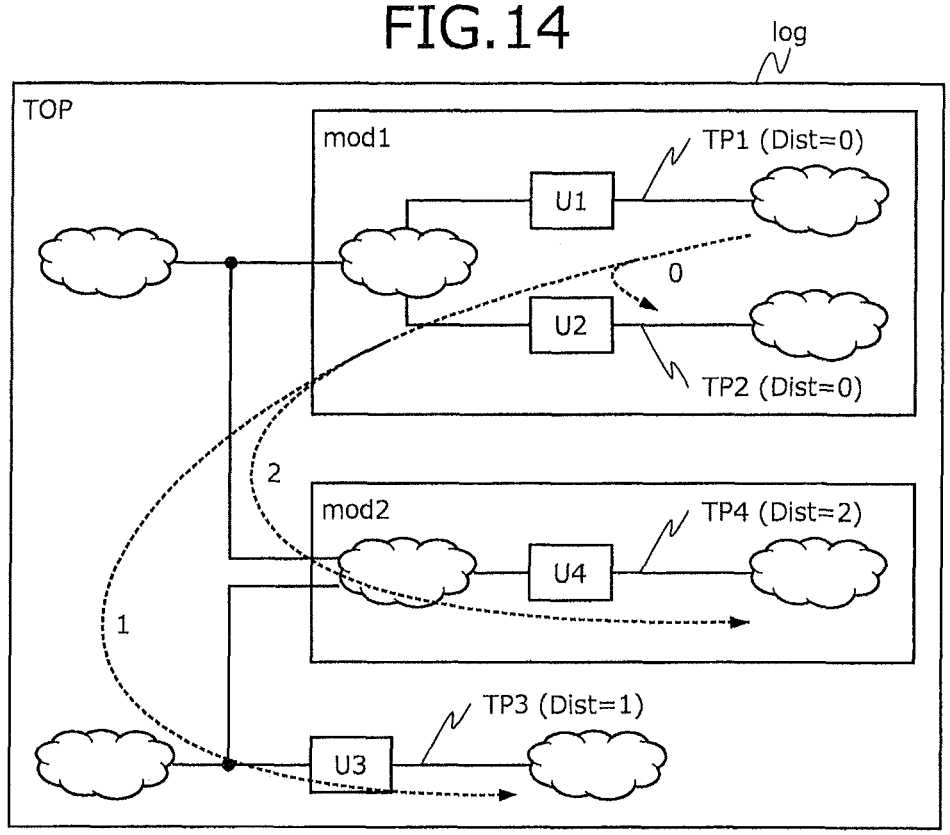
FIG. 14 is an explanatory diagram of an example of detection of an inter-module distance.
Figure 15:
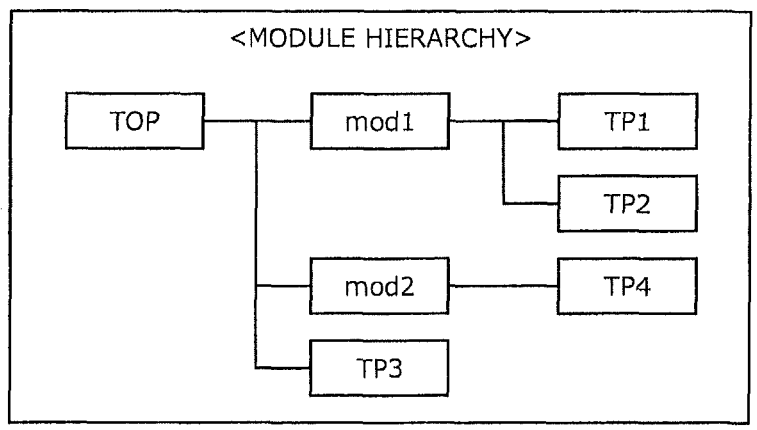
FIG. 15 is an explanatory diagram of an example of hierarchy of modules.

FIG. 14 is an explanatory diagram of an example of detection of the inter-module distance. FIG. 15 is an explanatory diagram of an example of hierarchy of the modules. FIG. 16 is an explanatory diagram of an example of the candidate TP set obtained after the setting of the inter-module distance. It is assumed that the candidate TP TP1 is the reference candidate. As indicated by the hierarchy, the candidate TPs TP1 and TP2 are present in the same module and therefore, the inter-module distance "Dist" between the candidate TPs TP1 and TP2 is zero. As indicated by the hierarchy, the candidate TPs TP1 and TP3 are present with one module therebetween and therefore, the inter-module distance "Dist" between the candidate TPs TP1 and TP3 is one. As indicated by the hierarchy, the candidate TPs TP1 and TP4 are present with two modules therebetween and therefore, the inter-module distance "Dist" between the candidate TPs TP1 and TP4 is two.

The circuit design support apparatus 100 selects any one shared circuit from the shared circuits that each execute the logical computation whose non-controlling value is equal to the type "type" of the selected candidate TP of the plural shared circuits, based on the order "order" of the shared circuits of the various types of shared circuits. For example, the circuit design support apparatus 100 selects the shared circuit whose area reduction effect is the highest among the shared circuits that each executes the logical computation whose non-controlling value is equal to the type "type" of the reference candidate TP of the plural shared circuits. As described, the shared circuit information sp_list has the shared circuit names registered therein in descending order of the area reduction effect. Therefore, the circuit design support apparatus 100 selects the shared circuits from the one registered at the head of the shared circuits respectively executing the logical computation whose non-controlling value is equal to the type "type" of the reference candidate TP, among the shared circuits indicated by the shared circuit information sp_list. In this case, for example, the three-input NOR circuit is selected. The selected shared circuit will be referred to as "selected shared circuit sp".

A candidate TP tending to be controlled to be "0" is correlated with an input terminal of a shared circuit that executes the logical computation whose non-controlling value is "0". Thereby, degradation can be prevented of the ease of the observation at the observation point in a case where the input terminal of the shared circuit executing EXOR is correlated with the candidate TP. A candidate TP tending to be controlled to be "1" is correlated with an input terminal of a shared circuit that executes the logical computation whose non-controlling value is "1". Thereby, degradation can be prevented of the ease of the observation at the observation point in a case where the shared circuit executing EXOR is assigned to the candidate TP.

The correlation information generating unit 505 correlates each input terminal of the selected shared circuit sp with a candidate TP whose type "type" is equal to the non-controlling value of the logical computation executed for an input signal input into the input terminal of the candidate TPS represented by the candidate TP set TP_obs. Thereby, the correlation information generating unit 505 generates the correlation information 101. As to the correlation information 101 in this case, the correlation information 101 is generated that correlates the reference candidate TP with the input terminal at which the non-controlling value of the logical computation executed for the input signal is equal to the type "type" of the reference candidate TP, among the input terminals of the selected shared circuit sp. The input terminal of the selected shared circuit sp can be identified based on, for example, a cell library "lib" that is correlated with the shared circuit information sp_list. In this case, for example, the circuit design support apparatus 100 correlates an input terminal 1 of the three-input NOR circuit with the candidate TP TP1 selected as the reference candidate TP.

The correlation information generating unit 505 generates the correlation information 101 by correlating a candidate TP with each of the remaining input terminals other than the input terminal correlated with the reference candidate TP. The correlation information generating unit 505 generates the correlation information 101 by correlating each of the remaining input terminals with any one candidate TP among the candidate TPs whose inter-module distances "Dist" are each equal to or shorter than a threshold value Dist_limit of the candidate TPs other than the reference candidate TP. When the observation point is inserted, no layout design of the circuit is executed. However, for the candidate TPs whose inter-module distances "Dist" are long, the disposition positions of the candidate TPs in the layout are highly likely to be far from each other. Therefore, when the candidate TPs whose inter-module distances "Dist" are long share an observation point, there may be cases when no layout design is executed. As in this embodiment, candidate TPs whose inter-module distances "Dist" are short are caused to share an observation point; thereby, the candidate TPs disposed closer to each other in the layout designing can be caused to share the observation point; and therefore, the layout design can be made easily.

The candidate TPs whose types "type" are each equal to the non-controlling value of the three-input NOR circuit are the candidate TPs TP3 and TP4. The correlation information generating unit 505 generates the correlation information 101 by correlating the candidate TPs TP3 and TP4 respectively with the remaining input terminals 2 and 3 other than the input terminal correlated with the reference candidate TP. The correlation information 101 is generated for the number of added shared circuits (in FIG. 5, represented by "m").

FIG. 17 is an explanatory diagram of an example of correlation information 1. The correlation information 101-1 has fields for the shared circuit name, the input terminal name, and the candidate TP name. The correlation information 101-1 indicates that the input terminal 1 is correlated with the candidate TP TP1; the input terminal 2 is correlated with the candidate TP TP3; and the input terminal 3 is correlated with the candidate TP TP4.

The circuit determining unit 506 determines that a circuit formed by connecting to the circuit under-design "log", the shared circuit selected according to the correlation based on the generated correlation information 101-1 is a new circuit under-design "log".

Figure 18:
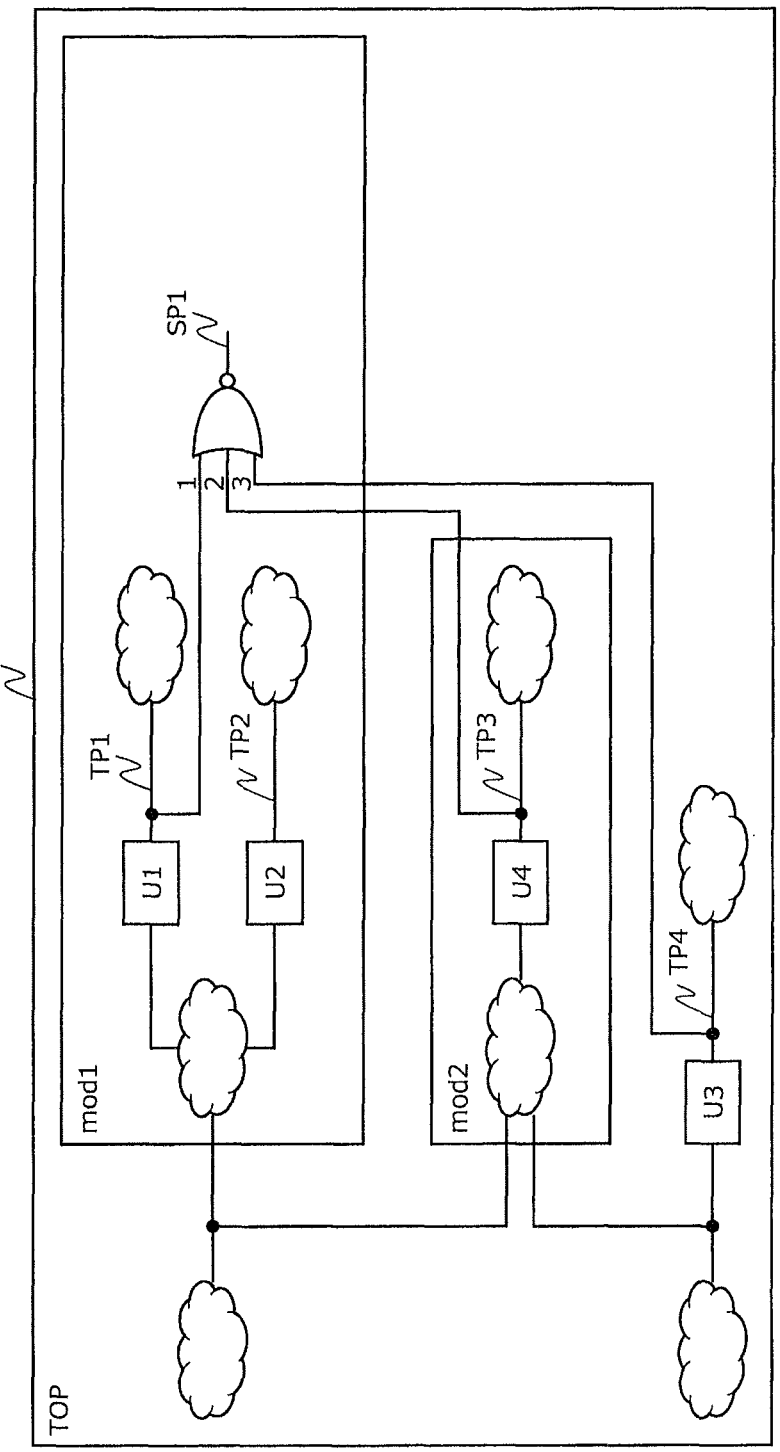
FIG. 18 is an explanatory diagram of an example of circuit under-design 1 to which a shared circuit is connected.

FIG. 18 is an explanatory diagram of an example of circuit under-design 1 to which the shared circuit is connected. For example, the circuit determining unit 506 determines according to the correlation information 101-1 that the circuit formed by connecting each input terminal of the selected three-input NOR circuit to the candidate TP is the new circuit under-design "log". For the new circuit under-design "log", the candidate TP TP1 is connected to the input terminal 1 of the three-input NOR circuit; the candidate TP TP3 is connected to the input terminal 2 thereof; and the candidate TP TP4 is connected to the input terminal 3 thereof.

The candidate TP determining unit 507 determines the signal line from the output terminal of the newly connected shared circuit, and a candidate TP other than the candidate TPs correlated based on the generated correlation information 101 of the plural candidate TPs to be the new candidate TPs to be observed. For example, the candidate TP from the output terminal of the shared circuit is SP1. The candidate TP other than the candidate TPs correlated based on the correlation information 101 represented by the candidate TP set TP_obs is TP2.

The candidate TP determining unit 507 determines the signal line from the output terminal of the selected shared circuit in the determined new circuit under-design "log" to be a candidate TP. For example, the candidate TP determining unit 507 causes the candidate TP set generating unit 502 to generate an element representing the candidate TP from the output terminal of the shared circuit; and to register the element generated by the candidate TP set generating unit 502 into the candidate TP set.

The sharing stage number determining unit 508 determines if the signal line from the output terminal of the shared circuit added in the new circuit under-design "log" propagates the signal propagated through shared circuits of a sharing stage number that is equal to or greater than a predetermined stage number in the new circuit under-design "log". The sharing stage number determining unit 508 identifies the largest sharing stage number "Depth" among the sharing stage numbers "Depth" of the elements representing the candidate TPs correlated based on the correlation information 101; sets a value obtained by incrementing by one the identified sharing stage number "Depth" to be the sharing stage number "Depth" of the candidate TP from the output terminal of the connected shared circuit; and determines if the sharing stage number "Depth" of the candidate TP from the output terminal of the connected shared circuit is equal to or greater than the predetermined stage number Depth_limit. The predetermined stage number Depth_limit is a value determined in advance by a user and is stored in advance in a storage apparatus such as the disk 405.

When the sharing stage number determining unit 508 determines that a signal is propagated that is propagated through the shared circuits of a stage number that is equal to or greater than the predetermined stage number Depth_limit, the connection information generating unit 509 generates information indicating that the signal line from the output terminal of the connected shared circuit is connected to the observation point at which the signal value is observable. For example, the connection information generating unit 509 registers the element representing the candidate TP into the connection destination information SP and thereby, generates the information indicating that the observation point is caused to be connected. An example of connection destination information SP will be described later. When the sharing stage number determining unit 508 determines that a signal is propagated that is propagated through the shared circuits of a stage number that is equal to or greater than the predetermined stage number Depth_limit, the candidate TP determining unit 507 does not determine the signal line from the output terminal of the selected shared circuit in the determined new circuit under-design "log" to be a candidate TP.

In the example depicted in FIG. 18, the sharing stage number determining unit 508 determines that the number is smaller than the predetermined stage number Depth_limit. Therefore, the candidate TP set generating unit 502 generates an element representing the candidate TP from the output terminal of the connected shared circuit; registers the generated element into the generated candidate TP set TP_obs; and deletes the element representing the candidate TP correlated based on the correlation information 101 from the candidate TP set TP_obs.

FIG. 19 is an explanatory diagram of an example of a new candidate TP set 1. The type "type" of the element representing the new candidate TP SP1 is determined by the determining unit and "1" is set in this case. The initial value is set in the inter-module distance "Dist" of the element representing the candidate TP SP1. One is set to be the sharing stage number of the element representing the candidate TP SP1. The elements representing the candidate TPs TP1, TP3, and TP4 are deleted from the candidate TP set TP_obs.

The candidate TP selecting unit 503 selects any one reference candidate TP from the candidate TPs represented by the new candidate TP set TP_obs. In this case, for example, the candidate TP selecting unit 503 selects the candidate TP TP2 as the reference candidate TP.

The shared circuit selecting unit 504 selects the shared circuit whose non-controlling value is equal to the type "type" of the reference candidate TP, from the plural shared circuits based on the order "order". In this case, for example, the shared circuit selecting unit 504 selects the three-input NAND circuit because the type "type" of the candidate TP TP2 is "1".

The correlation information generating unit 505 generates the correlation information 101 as described above. In this case, only two candidate TPs whose types "type" are each "1" are included in the candidate TPs represented by the candidate TP set TP_obs and therefore, no candidate TP is present that is correlated with the input terminal 3 of the three-input NAND circuit.

Therefore, the shared circuit selecting unit 504 newly selects a shared circuit whose non-controlling value is equal to the type "type" of the reference candidate TP, from the shared circuits other than the shared circuits already selected of the various types of shared circuits. In this case, for example, the shared circuit selecting unit 504 selects the two-input NAND circuit. The correlation information generating unit 505 generates the correlation information 101 as described above.

FIG. 20 is an explanatory diagram of an example of correlation information 2. The correlation information 101-2 indicates that the candidate TP TP2 is correlated with an input terminal 1 of the two-input NAND circuit and the candidate TP SP1 is correlated with an input terminal 2 thereof.

Similarly as described above, the circuit determining unit 506 determines a new circuit under-design "log" and the sharing stage number determining unit 508 determines whether the sharing stage number "Depth" is equal to or smaller than the predetermined number Depth_limit.

Figure 21:
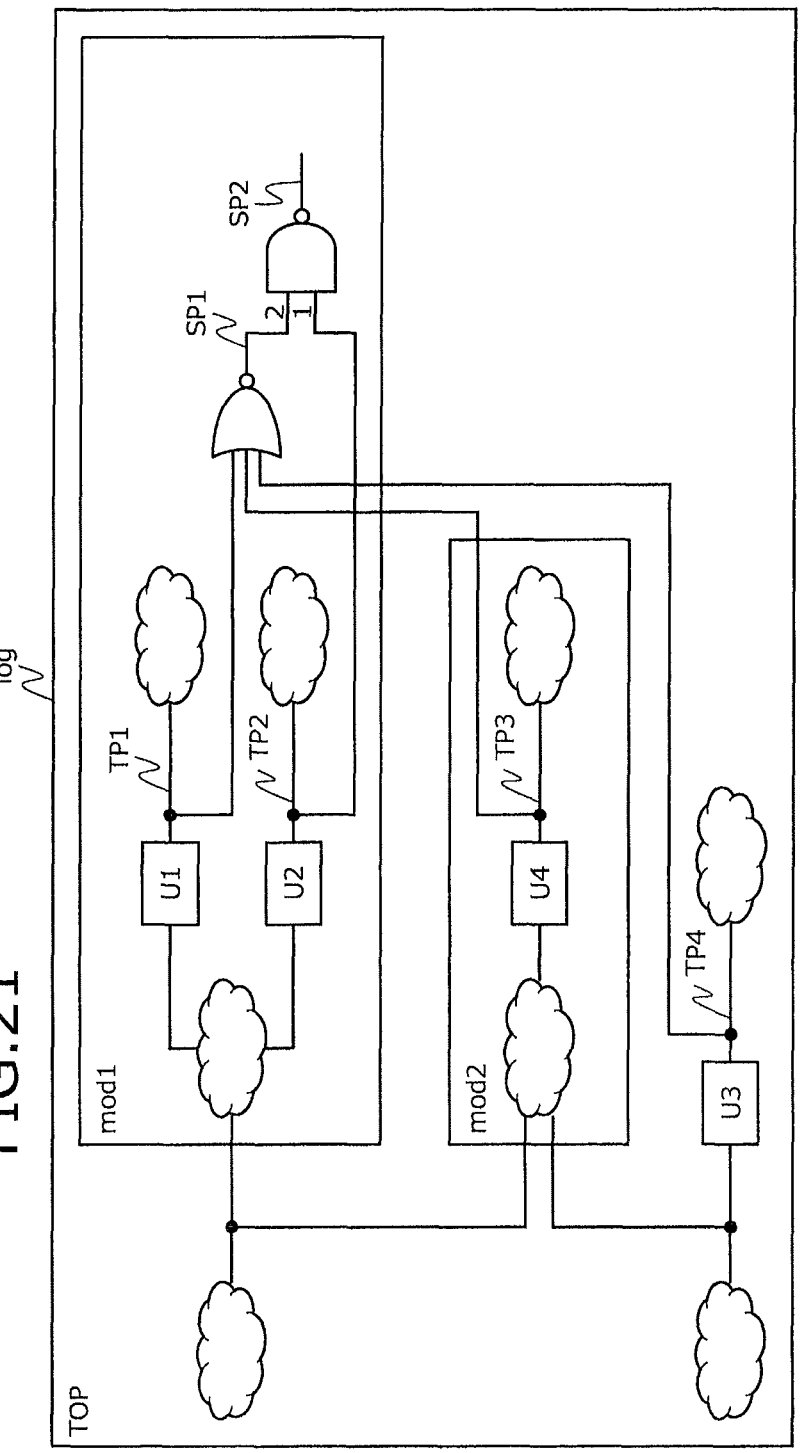
FIG. 21 is an explanatory diagram of an example of a circuit under-design 2 to which the shared circuit is connected.

FIG. 21 is an explanatory diagram of an example of a circuit under-design 2 to which the shared circuit is connected. For example, the circuit determining unit 506 determines the circuit formed by connecting the candidate TP TP2 to the input terminal 1 of the two-input NAND circuit and the candidate TP SP1 to the input terminal 2 thereof according to the correlation information 101-2 to be a new circuit under-design "log". In the example depicted in FIG. 21, the sharing stage number determining unit 508 determines that the signal is propagated that is propagated through the shared circuits of the number that is smaller than the predetermined stage number Depth_limit.

Similarly as described above, the candidate TP determining unit 507 and the candidate TP set generating unit 502 generate a new candidate TP set TP_obs.

FIG. 22 is an explanatory diagram of an example of a new candidate TP set 2. The type "type" of the element representing the new candidate TP SP2 is determined by the determining unit and, in this case, "0" is set. An initial value is set to be the inter-module distance "Dist" of the element representing the candidate TP SP1. Two is set to be the sharing stage number of the element representing the candidate TP SP1. The elements representing the candidate TPs TP2 and SP1 are deleted from the candidate TP set TP_obs.

As depicted in FIG. 22, the candidate TP selecting unit 503 does not newly select any candidate TP as the reference candidate TP when the number of candidate TP represented by the candidate TP set TP_obs is one. The connection information generating unit 509 generates information indicating that the candidate TP represented by the candidate TP set TP_obs is caused to be connected to an observation point at which the signal value is observable. For example, the connection information generating unit 509 generates the information indicating that the candidate TP is caused to be connected to the observation point, by registering the element representing the candidate TP into the connection destination information SP.

FIG. 23 is an explanatory diagram of an example of the connection destination information. The element of the candidate TP SP2 is registered into the connection destination information SP.

The circuit information generating unit 510 generates circuit information "logout" that indicates the new circuit under-design "log" formed by causing the circuit under-design "log" to be connected to the shared circuits according to the correlation information 101 and causing the circuit under-design "log" to be connected to the observation point according to the connection destination information SP, based on the obtained circuit information "login". The circuit information generating unit 510 outputs the generated circuit information "logout". The form of the output may be storage to the disk 405, etc.; output to the output apparatus 408 such as a display; or output to another apparatus through the network NET using the I/F 406.

Figure 24:
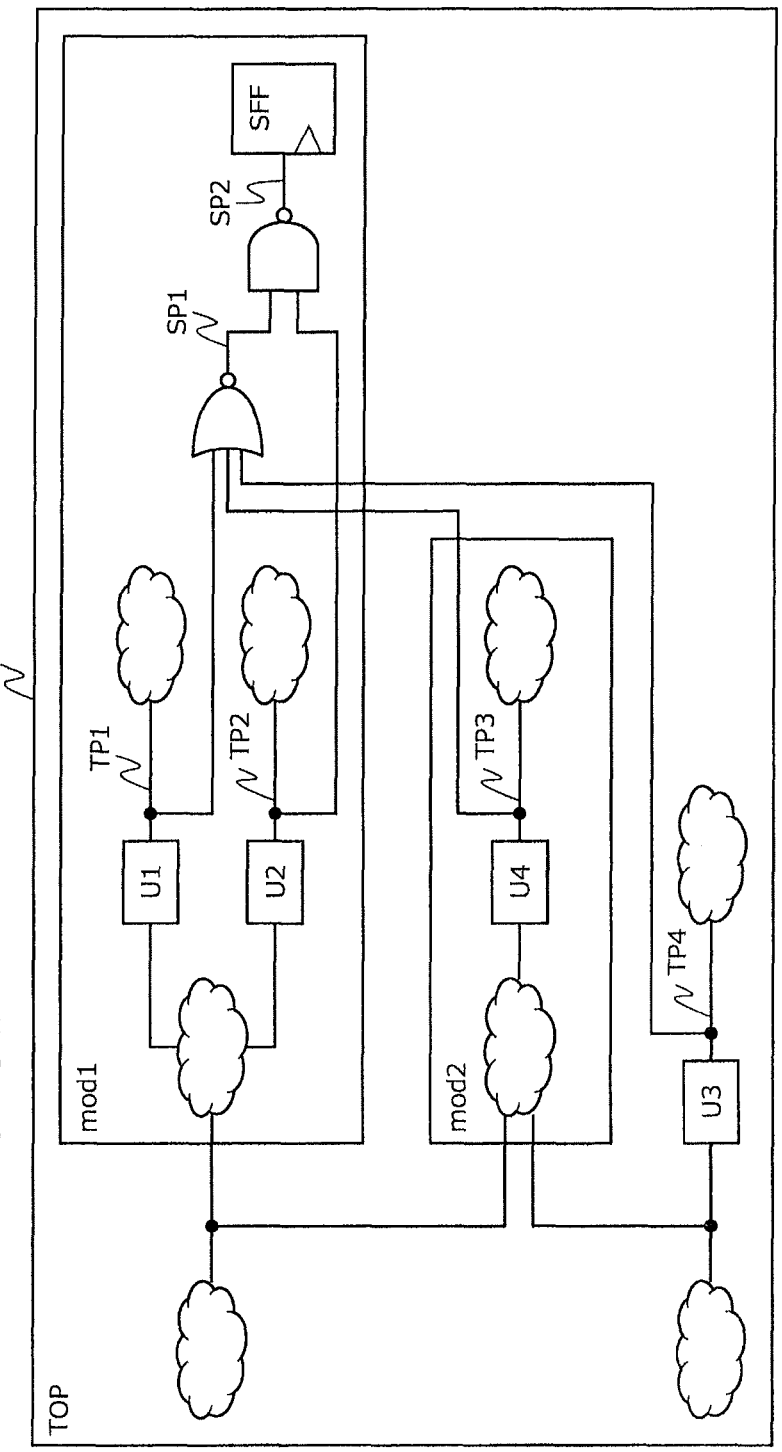
FIG. 24 is an explanatory diagram of an example of the circuit under-design after the observation point is connected thereto.

FIG. 24 is an explanatory diagram of an example of the circuit under-design after the observation point is connected thereto. For example, as depicted in FIG. 24, the SFF to be the observation point is inserted into the candidate TP SP2. Thereby, the SFF can be caused to observe the values of the candidate TPs TP1 to TP4.

An example of sharing for each type of logical computation and of sharing by the complex gate will be described.

Figure 25:
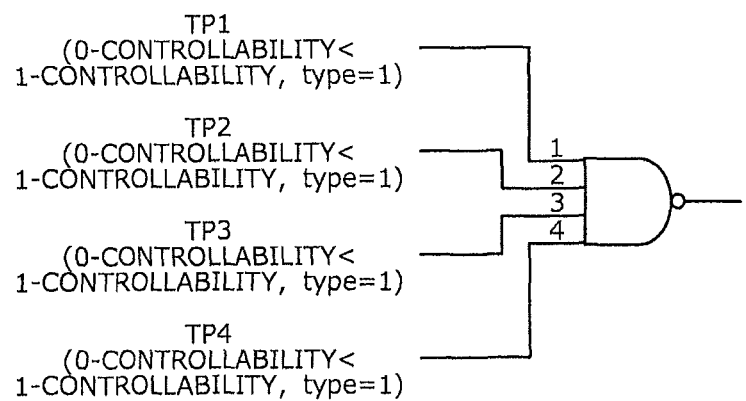
FIG. 25 is an explanatory diagram of an example of sharing by using a NAND circuit.

FIG. 25 is an explanatory diagram of an example of sharing by using the NAND circuit. In FIG. 25, taking an example of a four-input NAND circuit, the type "type" of each candidate TP is determined assuming that $\alpha$ is $\alpha=0$. As described above, the non-controlling value of the four-input NAND circuit is "1" and therefore, the correlation information generating unit 505 correlates the candidate TP whose type "type" is "1" with each of the input terminals of the four-input NAND circuit.

Figure 26:
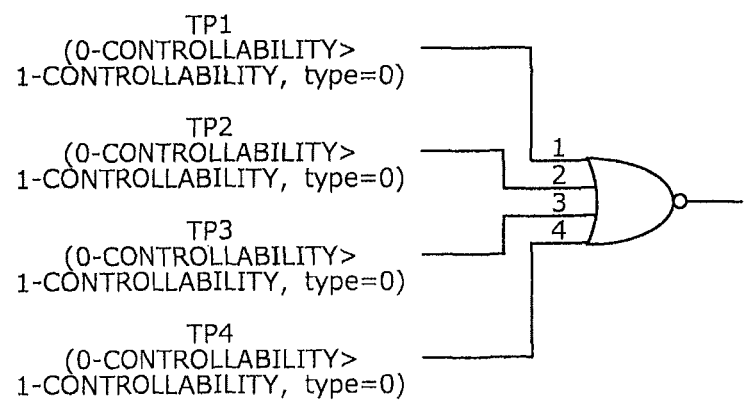
FIG. 26 is an explanatory diagram of an example of sharing by using a NOR circuit.

FIG. 26 is an explanatory diagram of an example of sharing by using the NOR circuit. In the example depicted in FIG. 26, the type "type" of each candidate TP is determined assuming that $\alpha$ is $\alpha=0$. In FIG. 26, taking an example of a four-input NOR circuit, the type "type" of each candidate TP is determined assuming that $\alpha$ is $\alpha=0$. As described above, the non-controlling value of the four-input NOR circuit is "0" and therefore, the correlation information generating unit 505 correlates the candidate TP whose type "type" is "0" with each of the input terminals of the four-input NOR circuit.

Figure 27:
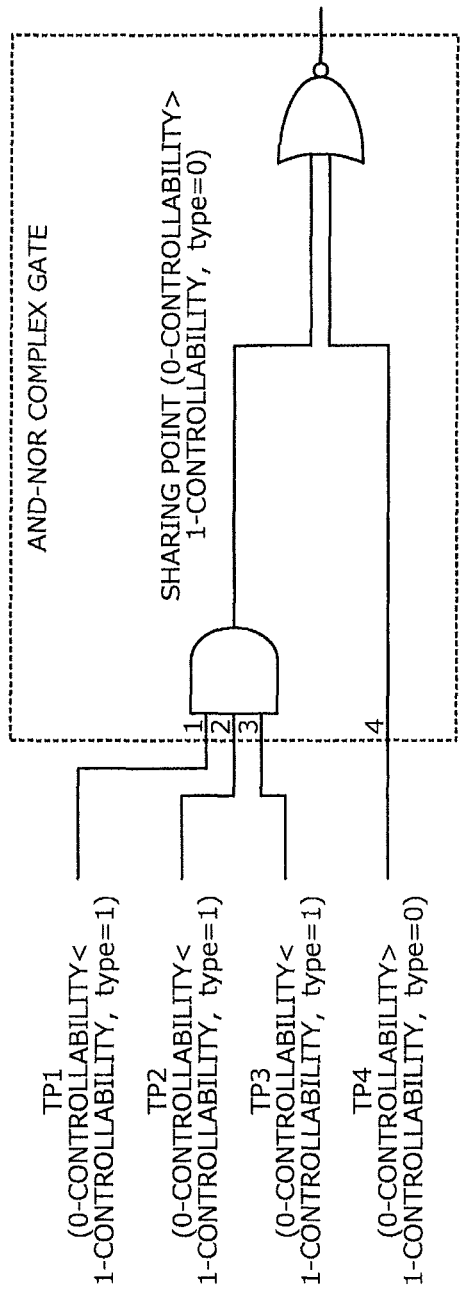
FIG. 27 is an explanatory diagram of an example of sharing by using an AND-NOR complex gate.

FIG. 27 is an explanatory diagram of an example of sharing by using the AND-NOR complex gate. Input terminals are 1 to 4 of the AND-NOR complex gate depicted in FIG. 27. For example, logical computation executed for each of the input signals input into the input terminals 1 to 3 is AND. As described above, the non-controlling value of AND is "1" and therefore, as depicted in FIG. 27, the correlation information generating unit 505 respectively correlates the candidate TPs TP1 to TP3 whose type "type" is "1" with the input terminals 1 to 3 of the AND-NOR complex gate.

The logical computation executed for the input signal input into the input terminal 4 is NOR. As described above, the non-controlling value of NOR is "0" and therefore, as depicted in FIG. 27, the correlation information generating unit 505 correlates the candidate TP TP4 whose type "type" is "0" with the input terminal 4 of the AND-NOR complex gate.

As depicted in FIG. 27, when α is α=0, the 0-controllability is higher than the 1-controllability at the sharing point in the AND-NOR complex gate and therefore, the type "type" of the sharing point is "0". The sharing point is connected to an input terminal of the NOR circuit. Therefore, the AND-NOR complex gate is usable as a shared circuit.

Figure 28:
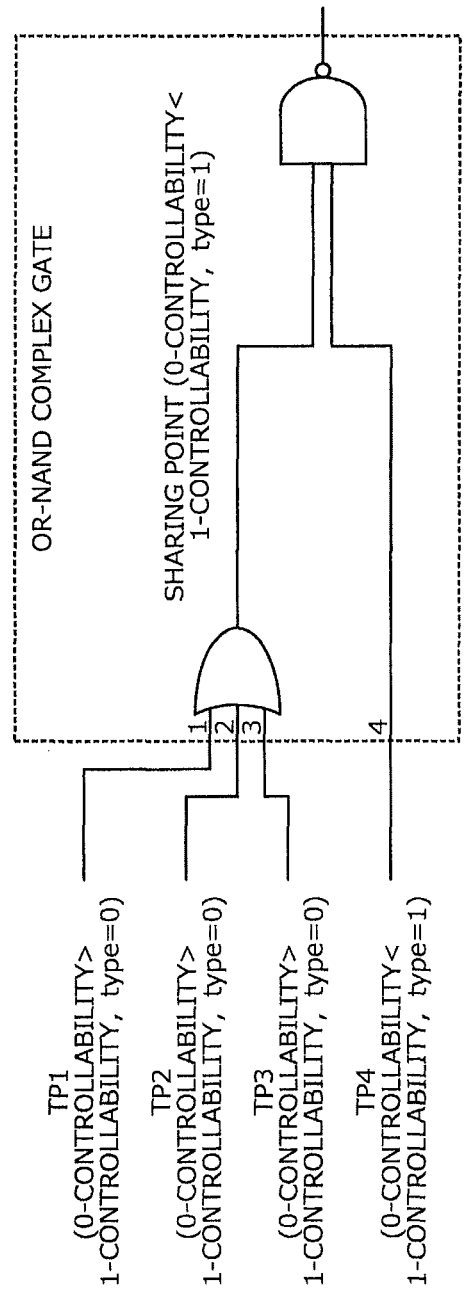
FIG. 28 is an explanatory diagram of an example of sharing by using an OR-NAND complex gate.

FIG. 28 is an explanatory diagram of an example of sharing by using the OR-NAND complex gate. Input terminals are 1 to 4 of the OR-NAND complex gate depicted in FIG. 28. For example, logical computation executed for each of the input signals input into the input terminals 1 to 3 is OR. As described above, the non-controlling value of OR is "0". Therefore, as depicted in FIG. 28, the correlation information generating unit 505 respectively correlates the candidate TPs TP1 to TP3 whose type "type" is "0" with the input terminals 1-3 of the OR-NAND complex gate.

Logical computation executed for the input signal input into the input terminal 4 is NAND. As described above, the non-controlling value of NAND is "1". Therefore, as depicted in FIG. 28, the correlation information generating unit 505 correlates the candidate TP TP4 whose type "type" is "1" with the input terminal 4 of the OR-NAND complex gate.

As depicted in FIG. 28, when α is α=0, the 1-controllability is higher than the 0-controllability at the sharing point in the OR-NAND complex gate and therefore, the type "type" of the sharing point is "1". The sharing point is connected to the input terminal of the NOR circuit. Therefore, the OR-NAND complex gate can be used as a shared circuit.

Figure 29A:
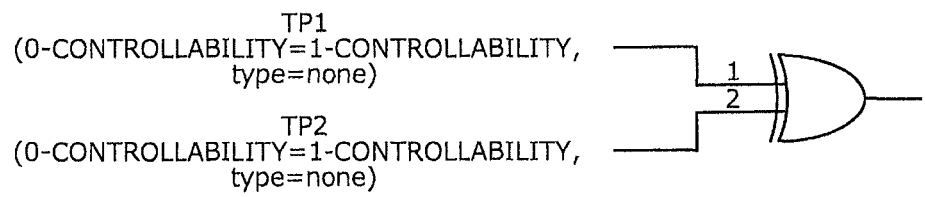
FIGS. 29A, 29B, and 29C are explanatory diagrams of examples of sharing by using an EXOR circuit.
Figure 29B:
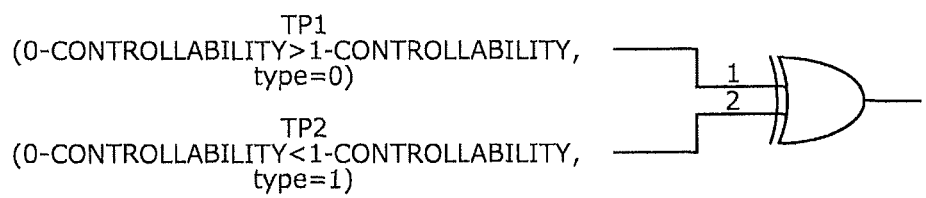
Figure 29C:
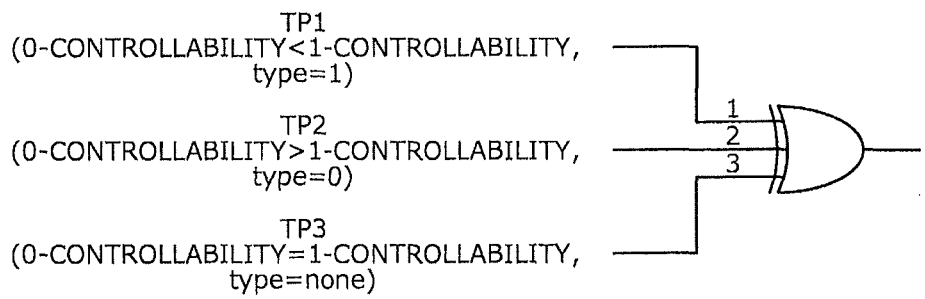

FIGS. 29A, 29B, and 29C are explanatory diagrams of examples of sharing by using the EXOR circuit. In the examples depicted in FIGS. 29A to 29C, the type "type" of each candidate TP is determined assuming that α is α=0. As described above, the non-controlling value of the EXOR circuit is "none". As depicted in FIG. 29A, the correlation information generating unit 505 correlates the candidate TPs whose type "type" is "none" with the input terminals of the two-input EXOR circuit.

As depicted in FIGS. 29B and 29C, even in a case where plural candidate TPs are present that are represented by the candidate TP set TP_obs, when the respective types "type" are not equal to one another, no candidate TP can be correlated with an input terminal even after the NAND or the NOR circuit is selected as the shared circuit. Therefore, the shared circuit selecting circuit selects the EXOR circuit. The correlation information generating unit 505 may correlate with the input terminals of the EXOR circuit, the remaining candidate TPs that cannot to be shared by another shared circuit.

FIGS. 30, 31, and 32 are flowcharts of an example of a procedure for a design support process executed by the circuit design support apparatus according to the first example. The circuit design support apparatus 100 obtains the circuit information "login" on the circuit under-design "log" (step S3001); obtains the shared circuit information sp_list (step S3002); obtains the candidate TP information TPda (step S3003); and generates the candidate TP set TP_obs based on the candidate TP information TPda (step S3004).

The circuit design support apparatus 100 determines and sets the type "type" of each element of the candidate TP set TP_obs (step S3005); detects and sets the sharing stage number "Depth" of each element of the candidate TP set TP_obs (step S3006); sets the connection destination information SP to be SP=☐ (step S3007); and determines whether the number of elements of the candidate TP set TP_obs is greater than one (step S3008).

If the circuit design support apparatus 100 determines that the number of elements of the candidate TP set TP_obs is not greater than one (step S3008: NO), the circuit design support apparatus 100 adds the element of the candidate TP set to the connection destination information SP (step S3009); generates the circuit information "logout" that indicates the circuit formed by connecting the observation point to the candidate TPs represented by the elements of the connection destination information SP in the circuit under-design "log" (step S3010); outputs the generated circuit information "logout" (step S3011); and causes the series of process steps to come to an end.

On the other hand, if the circuit design support apparatus 100 determines that the number of elements of the candidate TP set TP_obs is greater than one (step S3008: YES), the circuit design support apparatus 100 extracts one element from the candidate TP set TP_obs and selects the element as the reference element TP (step S3101); and detects and sets the inter-module distance "Dist" between the reference candidate TP represented by the reference element tp and the remaining candidate TPs, for each of the remaining candidate TPs represented by the elements other than the reference element tp (step S3102).

The circuit design support apparatus 100 selects, as the selected shared circuit sp, the shared circuit that executes the logical computation whose non-controlling value is equal to the type of the reference candidate TP, from among the various types of shared circuit based on the order "order" (step S3103).

The circuit design support apparatus 100 correlates the reference candidate TP with any one input terminal among the input terminals for which the non-controlling value of the logical computation executed for each of input signals input thereto is equal to the type of the reference candidate TP, among the input terminals of the selected shared circuit sp (step S3104); identifies the candidate TP whose inter-module distance "Dist" is less than or equal to the threshold value Dist_limit, among the candidate TPs other than the reference candidate TP (step S3105); and generates the correlation information 101 by correlating the input terminals that are not correlated among the input terminals of the selected shared circuit sp and the candidate TPs whose type "type" is equal to the non-controlling value of the input terminals of the identified candidate TPs (step S3106).

The circuit design support apparatus 100 determines whether each of the input terminals of the selected shared circuit sp is correlated with a candidate TP (step S3107). If the circuit design support apparatus 100 determines that any one of the input terminals is not correlated with a candidate TP (step S3107: NO), the circuit design support apparatus 100 determines whether a shared circuit executing the logical computation whose non-controlling value is equal to the type "type" of the reference candidate TP is included among the unselected shared circuits (step S3108).

If the circuit design support apparatus 100 determines that a shared circuit is included (step S3108: YES), the circuit design support apparatus 100 selects the shared circuit as the selected shared circuit sp, based on the order "order" (step S3109) and the procedure returns to step S3104. On the other hand, if the circuit design support apparatus 100 determines that no such shared circuit is included (step S3108: NO), the circuit design support apparatus 100 determines whether the type "type" of the reference candidate TP is "none" (step S3110).

If the circuit design support apparatus 100 determines that the type "type" is "none" (step S3110: YES), the circuit design support apparatus 100 adds the reference element TP to the connection destination information SP (step S3111) and advances to the process at step S3008. On the other hand, if the circuit design support apparatus 100 determines that the type "type" is not "none" (step S3110: NO), the circuit design support apparatus 100 changes the type "type" of the reference candidate TP to "none" (step S3112) and returns to the process at step S3107.

On the other hand, if the circuit design support apparatus 100 determines at step S3107 that each input terminal is correlated (step S3107: YES), the circuit design support apparatus 100 determines the circuit formed by connecting the selected shared circuit sp to the circuit under-design "log" according to the correlation information 101 to be a new circuit under-design "log" (step S3201) and generates the circuit information "login" indicating the new determined circuit under-design "log" (step S3202).

The circuit design support apparatus 100 generates, as the candidate TP, the element that sets the signal line from the output terminal of the connected selected shared circuit sp (step S3203); determines and sets the type "type" of the generated element (step S3204); detects and sets the sharing stage number "Depth" of the generated element (step S3205); and determines whether the sharing stage number "Depth" is less than or equal to the predetermined stage number Depth_limit (step S3206).

If the circuit design support apparatus 100 determines that the sharing stage number "Depth" is less than or equal to the predetermined stage number Depth_limit (step S3206: YES), the circuit design support apparatus 100 adds the generated element to the candidate TP set TP_obs (step S3207). On the other hand, if the circuit design support apparatus 100 determines that the sharing stage number "Depth" is not equal to or smaller than the predetermined stage number Depth_limit (step S3206: NO), the circuit design support apparatus 100 adds the generated element to the connection destination information SP (step S3208).

After executing the process at step S3207 or S3208, the circuit design support apparatus 100 deletes the element representing the correlated candidate TP, from the candidate TP set TP_obs (step S3209) and advances to the process at step S3101.

As described above in the first example, the circuit design support apparatus 100 selects the shared circuit that executes the computation whose non-controlling value is equal to the value based on the controllability of the selected signal line to be observed, from the various types of shared circuit including the type thereof capable of reducing the area to a greater extent than the EXOR circuit. The circuit design support apparatus 100 correlates each input terminal of the selected shared circuit with the signal line whose value based on its controllability is equal to the non-controlling value of the logical computation executed for the signal input into the input terminal. Thereby, reduction of the area necessary for the shared circuit is facilitated within a range for the value of the signal line to be observable.

The circuit design support apparatus 100 newly selects a shared circuit when no signal line can be correlated with any one of the input terminals of the selected shared circuit. Thereby, all the input terminals of the shared circuit can each be correlated with a signal line. Therefore, the shared circuits can be selected corresponding to the number of the signal lines to be observed and the area necessary for the shared circuit can more be reduced.

The circuit design support apparatus 100 selects the shared circuit executing the computation whose non-controlling value is equal to the value based on the controllability of the selected signal line, from the various types of shared circuit, based on the descending order "order" of the area reduction effect. Thereby, the area necessary for the shared circuit can be reduced more.

The circuit design support apparatus 100 determines that the circuit formed by connecting the selected shared circuit to the circuit under-design "log" according to the correlation information 101 to be the new circuit under-design "log" and the signal line from the output terminal of the connected shared circuit to be the new signal line to be observed. Thereby, more signal lines can share the same observation point and the area necessary for the shared circuits can be reduced further.

The circuit design support apparatus 100 sets the number of shared circuits present in a section for the value of the signal line to be observed to be propagated to the observation point, to be less than or equal to the predetermined number. Thereby, any increase of the number of signal lines sharing the observation point can be suppressed, and any degradation of the ease of observation of the value of the signal line at the observation point can be suppressed.

The circuit design support apparatus 100 determines the signal line to be correlated with the input terminal of the selected shared circuit, from the signal lines to be observed other than the selected signal line each having, between the signal line and the selected signal line, modules of a number that is less than or equal to the threshold value. Thereby, the observation point can be caused to be shared by the signal lines that are highly likely to be disposed close to each other based on the layout. Therefore, any degradation can be suppressed of the ease of designing the layout due to the connection of the shared circuit.

Each input terminal of the shared circuit selected from the various types of shared circuits including the type thereof capable of reducing the area more than the EXOR circuit is correlated with the signal line whose value based on the controllability is equal to the non-controlling value of the computation executed for the input signal input into the input terminal. Thereby, observation of the value of the signal line is enabled, facilitating the reduction of the area of the circuit under-design "log". In a second example, after one candidate TP is selected, a shared circuit is selected based also on the type "type" of the selected candidate TP. On the other hand, in the first example, after one shared circuit is selected, the candidate TP is selected based on the non-controlling value of the computation executed by the selected shared circuit.

The shared circuit selecting unit 504 selects the shared circuit from the various types of shared circuit based on the order "order". The candidate TP selecting unit 503 selects the candidate TP whose type "type" is equal to the non-controlling value of the logical computation executed by the selected shared circuit, as the reference candidate TP. The details of the components other than the shared circuit selecting unit 504 and the candidate TP selecting unit 503 are same as those in the first example and will not again be described in detail.

Figure 33:
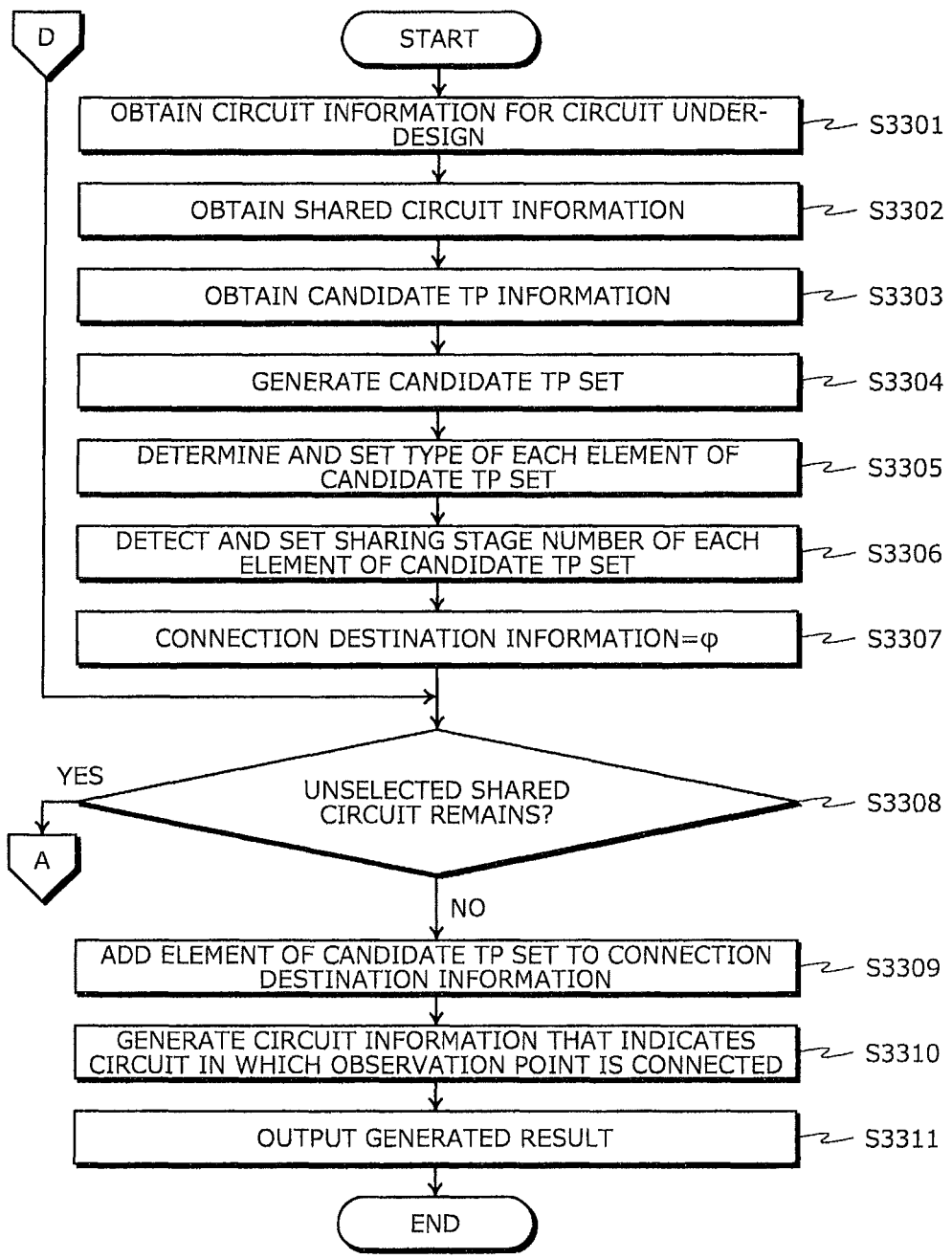
FIGS. 33 and 34 are flowcharts of an example of a procedure for a design support process executed by the circuit design support apparatus according to a second example.
Figure 34:
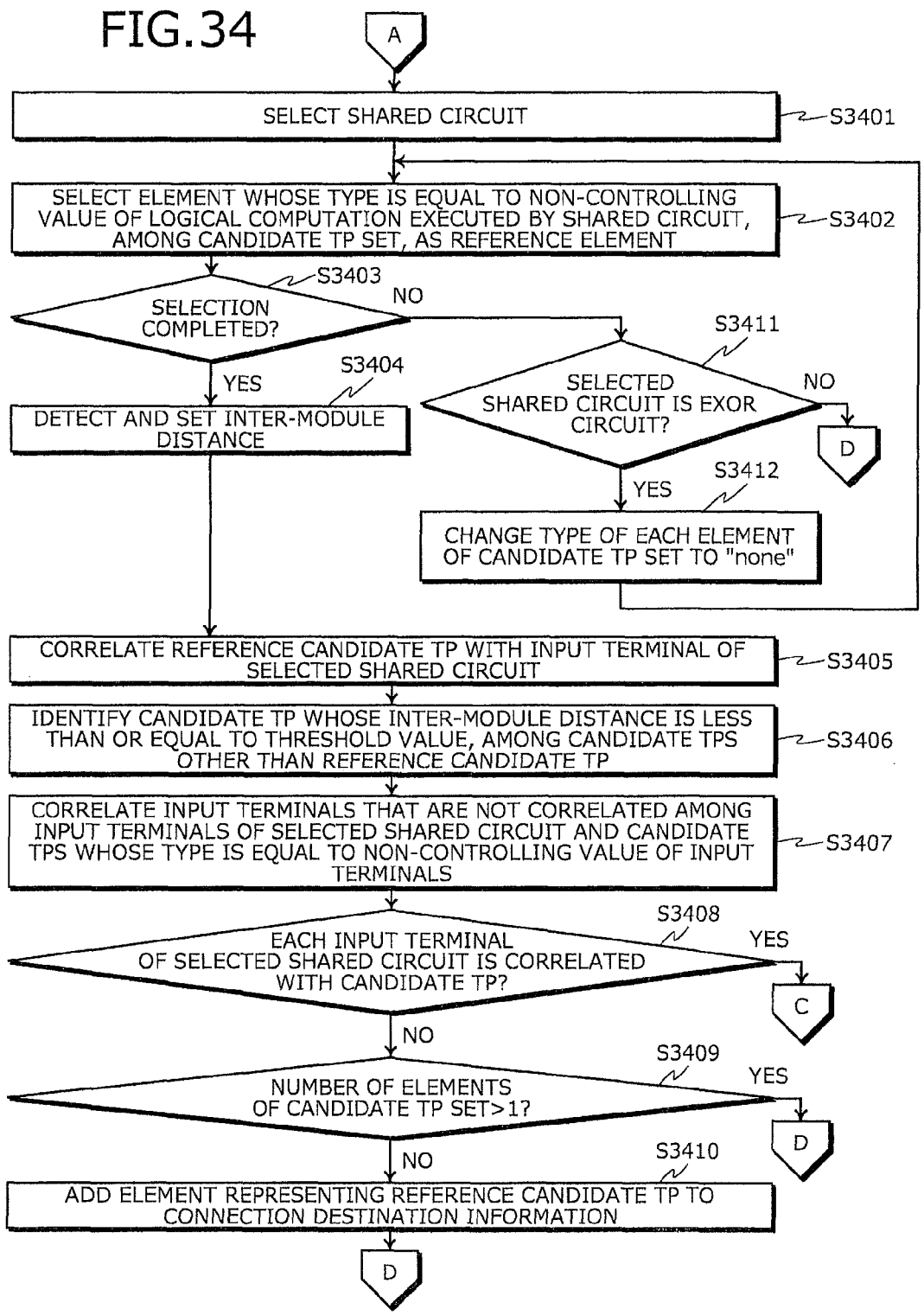

FIGS. 33 and 34 are flowcharts of an example of a procedure for a design support process executed by the circuit design support apparatus according to the second example. The circuit design support apparatus 100 obtains the circuit information "login" on the circuit under-design "log" (step S3301); obtains the shared circuit information sp_list (step S3302); obtains the candidate TP information TPda (step S3303); and generates the candidate TP set TP_obs based on the candidate TP information TPda (step S3304).

The circuit design support apparatus 100 determines and sets the type "type" of each element of the candidate TP set TP_obs (step S3305); detects and sets the sharing stage number "Depth" of each element of the candidate TP set TP_obs (step S3306); sets the connection destination information SP to be SP=□ (step S3307); and determines whether an unselected shared circuit that has not been selected remains (step S3308).

If the circuit design support apparatus 100 determines that no unselected shared circuit remains (step S3308: NO), the circuit design support apparatus 100 adds the element of the TP candidate set TP_obs to the connection destination information SP (step S3309); generates the circuit information that indicates the circuit formed by connecting the observation point to the candidate TPs represented by the elements of the connection destination information SP in the circuit under-design "log" (step S3310); outputs the generated circuit information "logout" (step S3311); and causes the series of process steps to come to an end.

On the other hand, if the circuit design support apparatus 100 determines that an unselected shared circuit is present (step S3308: YES), the circuit design support apparatus 100 selects a shared circuit from the unselected shared circuits based on the order "order" (step S3401); and selects an element whose type "type" is equal to the non-controlling value of the logical computation executed by the shared circuit, among the candidate TP set TP_obs, as the reference element tp (step S3402).

The circuit design support apparatus 100 determines whether selection has been completed (step S3403). If selection has been completed (step S3403: YES), the circuit design support apparatus 100, detects and sets the inter-module distance "Dist" between the reference candidate TP represented by the reference element tp and the remaining candidate TPs, for each of the remaining candidate TPs represented by the elements other than the reference element tp (step S3404).

The circuit design support apparatus 100 correlates the reference candidate TP with any one input terminal among the input terminals for which the non-controlling value of the logical computation executed for each of input signals input thereto is equal to the type of the reference candidate TP, among the input terminals of the selected shared circuit sp (step S3405); identifies the candidate TP whose inter-module distance "Dist" is less than or equal to the threshold value Dist_limit, among the candidate TPs other than the reference candidate TP (step S3406); and generates the correlation information 101 by correlating the input terminals that are not correlated among the input terminals of the selected shared circuit sp and the candidate TPs whose type "type" is equal to the non-controlling value of the input terminals of the identified candidate TPs (step S3407).

The circuit design support apparatus 100 determines whether each of the input terminals of the selected shared circuit sp is correlated with a candidate TP (step S3408). If the circuit design support apparatus 100 determines that any one of the input terminals is not correlated with a candidate TP (step S3408: NO), the circuit design support apparatus 100 determines whether the number of elements of the candidate TP set is greater than one (step S3409). If the circuit design support apparatus 100 determines that the number of elements of the candidate TP set Tp_obs is greater than one (step S3409: YES), the circuit design support apparatus 100 returns to the process at step S3308. If the circuit design support apparatus 100 determines that the number of elements of the candidate TP set Tp_obs is less than or equal to one (step S3409: NO), the circuit design support apparatus 100 adds the element tp representing the reference candidate TP to the connection destination information SP (step S3410) and advances to the process at step S3308.

On the other hand, if the circuit design support apparatus 100 determines at step S3408 that each of the input terminals of the selected shared circuit sp is correlated with a candidate TP (step S3408: YES), the circuit design support apparatus 100 advances to the process at step S3201. The processes at steps S3201 to S3209 are same as those described with reference to FIG. 32 and therefore, will not again be described in detail. In the second example, after executing the process at step S3209, the circuit design support apparatus 100 returns to the process at step S3401.

If the circuit design support apparatus 100 determines at step S3403 that the selection has not been completed (step S3403: NO), the circuit design support apparatus 100 determines whether the selected shared circuit is an EXOR circuit (step S3411). If the circuit design support apparatus 100 determines that the selected shared circuit is an EXOR circuit (step S3411: YES), the circuit design support apparatus 100 changes the type of each element of the candidate TP set to "none" (step S3412) and returns to the process at step S3402. If the circuit design support apparatus 100 determines that the selected shared circuit is not an EXOR circuit (step S3411: NO), the circuit design support apparatus 100 returns to the process at step S3308.

As described in the second example, the circuit design support apparatus 100 correlates an input terminal of the shared circuit selected from the various types of shared circuit including the type thereof capable of reducing the area more than the EXOR circuit, with a signal line whose value based on the controllability is equal to the non-controlling value of the computation of the shared circuit, among the signal lines to be observed. Thereby, observation of the value of the signal line is enabled facilitating the reduction of the area of the circuit under-design "log".

The circuit design support apparatus 100 selects the signal line whose value based on the controllability is equal to the non-controlling value of the computation of the selected shared circuit; and determines the signal line other than the selected signal line, to be correlated with the input terminal of the shared circuit, from among the remaining signal lines, that each have modules between the signal line and the selected signal line of a number that is less than or equal to the predetermined value.

An example of fault detection of a semiconductor integrated circuit depicted in FIG. 35 will be described.

Figure 35:
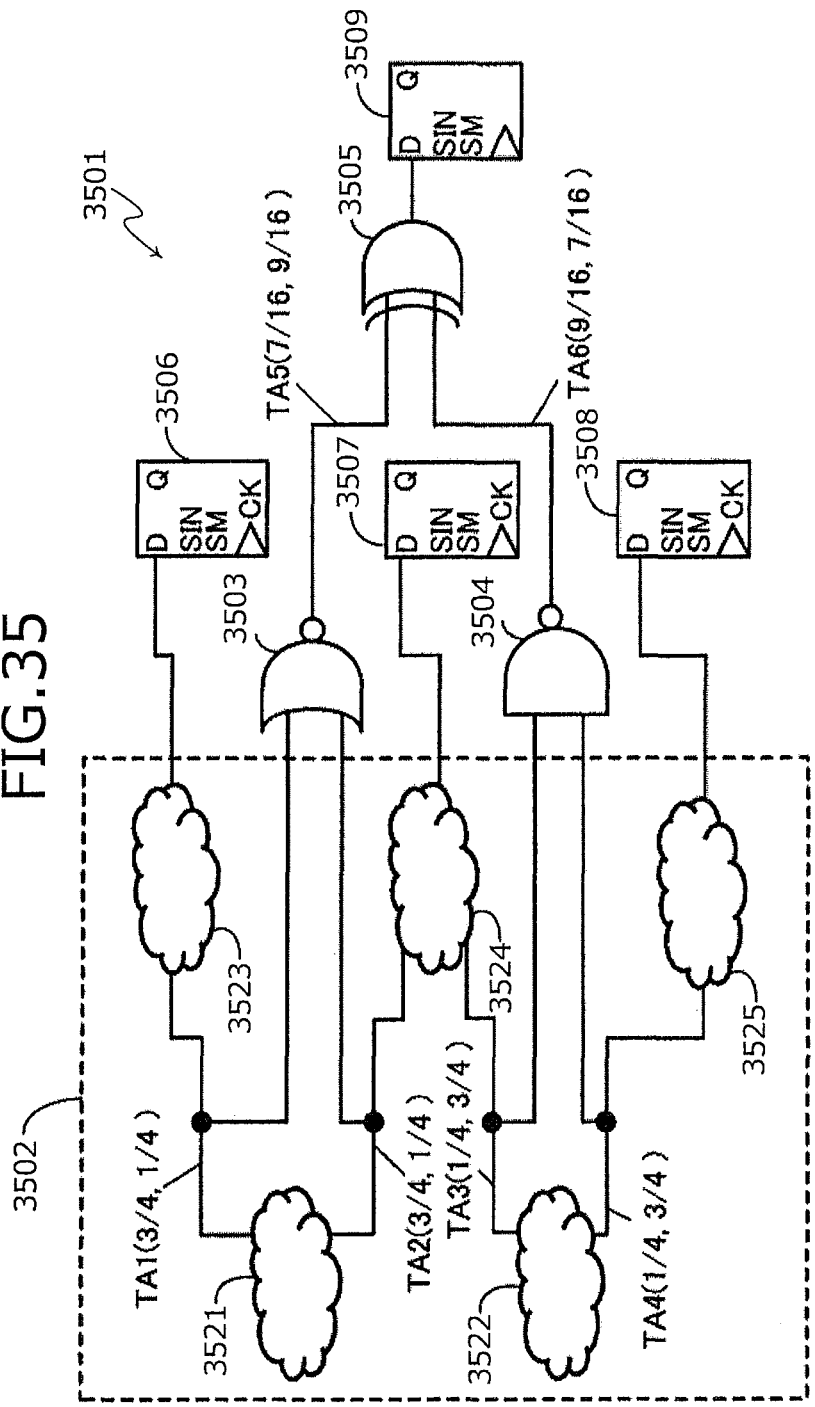
FIG. 35 is an explanatory diagram of an example of a semiconductor integrated circuit.

FIG. 35 is an explanatory diagram of an example of a semiconductor integrated circuit. The semiconductor integrated circuit 3501 includes a circuit under-test 3502, and a NOR circuit 3503 and a NAND circuit 3504 as shared circuits; and also includes an EXOR circuit 3505, SFFs 3506, 3507, 3508, and 3509.

The circuit under-test 3502 includes plural combinational circuits 3521, 3522, 3523, 3524, and 3525. Values in parentheses beside each of reference numerals of the signal lines TA1 to TA6 depicted in FIG. 35 represent the 0-controllability and the 1-controllability of the signal line. The value on the left in the parentheses is the value of the 0-controllability and that on the right is the value of the 1-controllability.

In the example of the semiconductor integrated circuit 3501 of FIG. 35, the signal lines TA1 to TA4 are the signal lines to be observed in the circuit under-test 3502. The NOR circuit 3503 is connected through input terminals thereof to the signal lines TA1 and TA2 to be observed of the circuit under-test 3502; computes the negative OR of the values propagated by the signal lines TA1 and TA2; and outputs an output value corresponding to the value propagated by either the signal line TA1 or TA2.

When a value input into one input terminal of the NOR circuit 3503 is "0", the NOR circuit 3503 outputs a value obtained by inverting the value input into the other input terminal thereof. Therefore, for example, when the value of the signal line TA2 is "0", the NOR circuit 3503 outputs an output value that corresponds to the value propagated by the signal line TA1. When the value of the signal line TA1 is "0", the NOR circuit 3503 outputs an output value that corresponds to the value propagated by the signal line TA2.

The NAND circuit 3504 is connected through input terminals thereof to the signal lines TA3 and TA4 to be observed of the circuit under-test 3502; computes the negative AND of the values propagated by the signal lines TA3 and TA4; and outputs an output value corresponding to the value propagated by either the signal line TA3 or TA4. When a value input into one input terminal of the NAND circuit 3504 is "1", the NAND circuit 3504 outputs a value obtained by inverting the value input into the other input terminal thereof. Therefore, for example, when the value of the signal line TA4 is "1", the NAND circuit 3504 outputs an output value that corresponds to the value propagated by the signal line TA3. When the value of the signal line TA3 is "1", the NAND circuit 3504 outputs an output value that corresponds to the value propagated by the signal line TA4.

The EXOR circuit 3505 receives input of the output values of the NOR circuit 3503 and the NAND circuit 3504 through the signal lines TA5 and TA6, and outputs a value corresponding to any one of the output values. For example, in the testing, when the output value of the NAND circuit 3504 is fixed to be "0" due to the test pattern input into the semiconductor integrated circuit 3501, the EXOR circuit 3505 outputs the output value of the NOR circuit 3503. When the output value of the NAND circuit 3504 is fixed to be "1", the EXOR circuit 3505 outputs a value obtained by inverting the output value of the NOR circuit 3503.

The SFFs 3506 to 3509 each include a data terminal D, a scan-in terminal SIN, a scan mode terminal SM, a clock terminal CK, and an output terminal Q. Although the connection relations, etc. of the terminals other than the data terminal D are not depicted, the SFFs 3506 to 3509 form a portion of a scan chain that functions as a shift register formed by connecting the plural SFFs in series. Therefore, the value captured by the SFFs 3506 to 3509 is externally observable.

The SFFs 3506 to 3508 respectively capture the output values of the combinational circuits 3523 to 3525 and the SFF 3509 captures the output value of the EXOR circuit 3505.

An operation of the semiconductor integrated circuit 3501 will be described. When a fault (such as a 0-degeneracy fault) occurring in the signal line TA1 is detected, for example, a test pattern causing the value of each of the signal lines TA2 and TA6 to be "0" is input into the semiconductor integrated circuit 3501. Thereby, an output value corresponding to the value propagated by the signal line TA1 is captured by the SFF 3509 through the NOR circuit 3503 and the EXOR circuit 3505, and the fault occurring in the signal line TA1 becomes detectable.

When a fault occurring in the signal line TA2 is detected, for example, a test pattern causing the value of each of the signal lines TA1 and TA6 to be "0" is input into the semiconductor integrated circuit 3501. Thereby, an output value corresponding to the value propagated by the signal line TA2 is captured by the SFF 3509 through the NOR circuit 3503 and the EXOR circuit 3505, and the fault occurring in the signal line TA2 becomes detectable.

When a fault occurring in the signal line TA3 is detected, for example, a test pattern causing the value of each of the signal lines TA4 and TA5 to be "1" is input into the semiconductor integrated circuit 3501. Thereby, an output value corresponding to the value propagated by the signal line TA3 is captured by the SFF 3509 through the NAND circuit 3504 and the EXOR circuit 3505, and the fault occurring in the signal line TA3 becomes detectable.

When a fault occurring in the signal line TA4 is detected, for example, a test pattern causing the value of each of the signal lines TA3 and TA5 to be "1" is input into the semiconductor integrated circuit 3501. Thereby, an output value corresponding to the value propagated by the signal line TA4 is captured by the SFF 3509 through the NAND circuit 3504 and the EXOR circuit 3505, and the fault occurring in the signal line TA4 becomes detectable.

As described above, the semiconductor integrated circuit 3501 detects the signal values of the plural signal lines using the NOR circuit 3503 and the NAND circuit 3504 and therefore, the area necessary for the shared circuit can be reduced more than in a case where the EXOR circuit detects the signal values of the plural signal lines.

Figure 36:
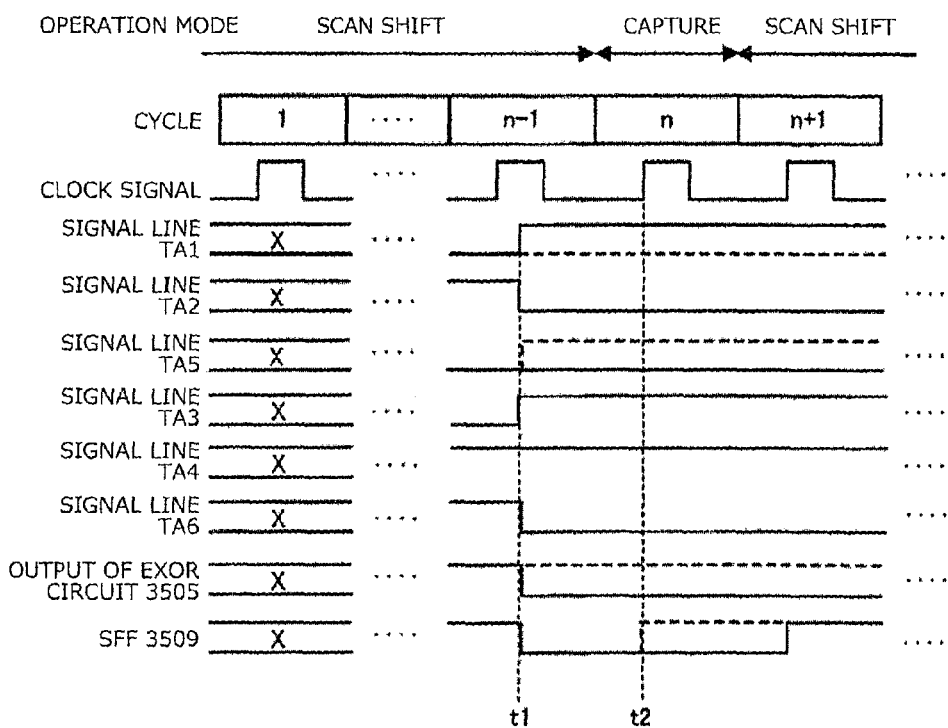
FIG. 36 is a timing chart of an example of signals in portions of a semiconductor integrated circuit during observation of a 0-degeneracy fault of a signal line TA1.

FIG. 36 is a timing chart of an example of the signals in the portions of the semiconductor integrated circuit during the observation of a 0-degeneracy fault of the signal line TA1. In this case, for example, an operation will be described of the semiconductor integrated circuit 3501 executed when the 0-degeneracy fault occurring in the signal line TA1 is observed. FIG. 36 depicts an example of the operation mode, the cycle, the clock signal, the values of the signal lines TA1 to TA6, the output of the EXOR circuit 3505, and the value captured by the SFF 3509. Signal values each depicted by a dotted line represent an example of the signal values obtained when the 0-degeneracy fault occurs in the signal line TA1.

The operation modes include a mode causing the shift register formed by connecting in series the plural SFFs that include the SFFs 3506 to 3509 as depicted in FIG. 35 to execute a scan shift operation, and a normal operation mode (in FIG. 36, depicted as a section labeled as "capture"). The switching between the modes is executed based on a control signal input into the scan mode terminal SM of each of the SFFs 3506 to 3509.

At the start of the scan shift operation, each of the values of the signal lines TA1 to TA6, the output of the EXOR circuit 3505, and the SFF 3509 is "X (undetermined value)". In FIG. 36, the details of the signals during the scan shift operation are not depicted.

In a last cycle n–1 of the scan shift operation, for example, a test pattern causing the signal line TA1 to be set to be "1" is scanned in (input into the shift register) by the CPU 401 (a timing t1).

At this timing, to detect the fault in the signal line TA1, a side input of the NOR circuit 3503 is set to be "0", which is the non-controlling value thereof, such that the NOR circuit 3503 propagates the value corresponding to the state of the signal line TA1. The signal line TA2 is set to be "0".

A side input of the EXOR circuit 3505 is set to be "0" or "1" such that the EXOR circuit 3505 propagates the value corresponding to the state of the signal line TA1 output from the NOR circuit 3503. This is because the EXOR circuit 3505 has no controlling value and therefore, can output the value corresponding to the signal input into an input terminal thereof even when the side input is "0" or "1". However, the signal line TA6 has higher 0-controllability than its 1-controllability as depicted in FIG. 35 and therefore, is set to be "0" in the example depicted in FIG. 36. To set the signal line TA6 to be "0", the signal lines TA3 and TA4 are both set to be "1".

When the signal line TA1 is normal, the NOR circuit 3503 outputs the negative OR of the value "1" propagated by the signal line TA1 and the value "0" propagated by the signal line TA2, and the value of the signal line TA5 is "0". The EXOR circuit 3505 outputs "0", which is the computation result of the exclusive OR of the value "0" propagated by the signal line TA5 and the value "0" propagated by the signal line TA6. The value that is captured by the SFF 3509 during the capture operation (cycle n) is still "0".

In contrast, when the 0-degeneracy fault occurs in the signal line TA1, the two input values for the NOR circuit 3503 are both "0" and therefore, the output value of the NOR circuit 3503 is "1" and the value of the signal line TA5 is "1". The two input values of the EXOR circuit 3505 are "1" and "0" and therefore, the output value from the EXOR circuit 3505 is "1". Therefore, the SFF 3509 captures "1" at the rising edge of the clock signal during the capture operation (the cycle n) (a timing t2). Thereafter, due to the scan shift operation during and after the cycle n+1, the value captured by the SFF 3509 is output from, for example, an external terminal (not depicted) of the semiconductor integrated circuit 3501 and the 0-degeneracy fault in the signal line TA1 is detected.

An example of an operation of the semiconductor integrated circuit 3501 executed when a 1-degeneracy fault occurring in the signal line TA3 of FIG. 35 is observed will be described with reference to FIG. 37.

Figure 37:
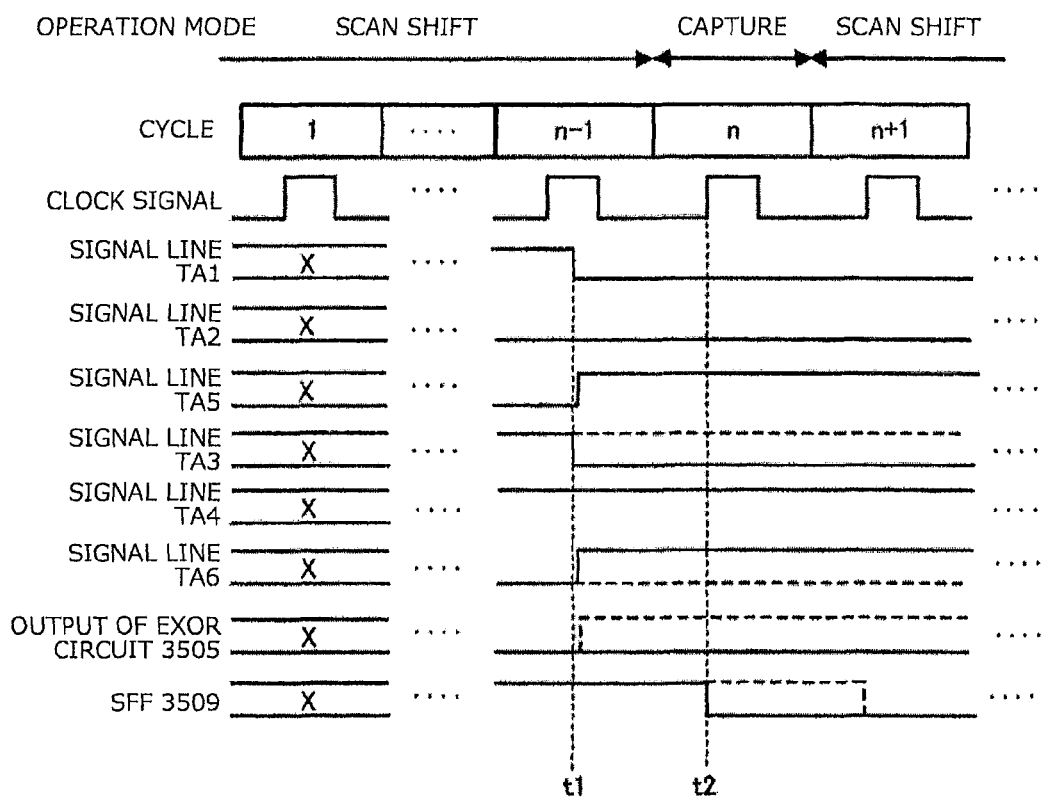
FIG. 37 is a timing chart of an example of signals in portions of the semiconductor integrated circuit obtained during observation of a 1-degeneracy fault of a signal line TA3.

FIG. 37 is a timing chart of an example of the signals in the portions of the semiconductor integrated circuit obtained during the observation of the 1-degeneracy fault of the signal line TA3. FIG. 37 depicts an example of the operation mode, the cycle, the clock signal, the values of the signal lines TA1 to TA6, the output of the EXOR circuit 3505, and the value captured by the SFF 3509. The signal values depicted by dotted lines represent an example of the signal values obtained when the 1-degeneracy fault in the signal line TA3 occurs.

At the start of the scan shift operation, each of the values of the signal lines TA1 to TA6, the output of the EXOR circuit 3505, and the SFF 3509 is "X". In FIG. 37, the details of the signals during the scan shift operation are not depicted.

In a last cycle n−1 of the scan shift operation, for example, a test pattern causing the signal line TA3 to be set to be "0" is scanned in (input into the shift register) by the CPU 401 (a timing t1).

At this timing, to detect the fault in the signal line TA3, a side input of the NAND circuit 3504 is set to be "1", which is the non-controlling value thereof, such that the NAND circuit 3504 propagates the value corresponding to the state of the signal line TA3. The signal line TA4 is set to be "1".

A side input of the NAND circuit 3504 is set to be "0" or "1" such that the EXOR circuit 3505 propagates the value corresponding to the state of the signal line TA3 output from the NAND circuit 3504. The signal line TA5 has higher 1-controllability than its 0-controllability as depicted in FIG. 35 and therefore, is set to be "1" in the example depicted in FIG. 37. To set the signal line TA5 to be "1", the signal lines TA1 and TA2 are both set to be "0".

When the signal line TA3 is normal, the NAND circuit 3504 outputs the negative AND of the value "0" propagated by the signal line TA0 and the value "1" propagated by the signal line TA4, and the value of the signal line TA6 is "1". The EXOR circuit 3505 outputs "0", which is the computation result of the exclusive OR of the value "1" propagated by the signal line TA5 and the value "1" propagated by the signal line TA6. The value that is captured by the SFF 3509 during the capture operation (cycle n) becomes "0" (the timing t2).

In contrast, when the 1-degeneracy fault occurs in the signal line TA3, the two input values for the NAND circuit 3504 are both "1" and therefore, the output value of the NAND circuit 3504 is "0" and the value of the signal line TA6 is "0". The two input values of the EXOR circuit 3505 are "1" and "0" and therefore, the output value from the EXOR circuit 3505 is "1". Therefore, the SFF 3509 captures "1" at the rising edge (the timing t2) of the clock signal during the capture operation (the cycle n). Thereafter, due to the scan shift operation during and after the cycle n+1, the value captured by the SFF 3509 is output from, for example, an external terminal (not depicted) of the semiconductor integrated circuit 3501 and the 1-degeneracy fault in the signal line TA3 is detected. Thus, various types of faults of the signal lines TA1 to TA4 in the circuit under-test 3502 can be detected by fault detection as described above.

The circuit design support method described in this embodiment can be realized by causing a computer such as a personal computer or a work station to execute a program prepared in advance. This design support program is recorded on a non-transitory, computer-readable recording medium such as the disk 405 or a universal serial bus (USB) flash memory, and is executed by being read from the recording medium by the computer. This design support program may be distributed the network NET such as the Internet.

According to an aspect of the embodiment, reduction of the area necessary for the shared circuit can be facilitated.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:
1. A circuit design support method, comprising:
obtaining, by a computer, shared circuit information indicating various types of shared circuits each executing at least any one of various types of logical computations to enable a plurality of signal lines to share an observation point at which a signal value is observable;
determining, for each of the plurality of signal lines to be observed in a circuit under-design, a value based on controllability representing ease of control to set a value of a corresponding signal line to a specific value;
selecting any one shared circuit among the various types of shared circuits, based on the obtained shared circuit information, the selecting including selecting any one shared circuit based on a sequence indicated by the obtained shared circuit information; and
generating correlation information that correlates each input terminal of the selected shared circuit with a signal line among the signal lines to be observed and that has a value determined therefor equal to a non-controlling value of a logical computation executed for an input signal input into the input terminal,
wherein the shared circuit information indicates order of the various types of shared circuit based on an area and a number of input terminals of each of the various types of shared circuits.

2. The circuit design support method according to claim 1, wherein
the selecting includes newly selecting, based on the obtained shared circuit information, any one shared circuit from among the shared circuits exclusive of the shared circuit already selected from among the various types of shared circuits, the newly selecting being implemented when none of the signal lines to be observed is able to be correlated with at least any one of the input terminals of the selected shared circuit at the generating of the correlation information, and
the generating of the correlation information that correlates each input terminal of the newly selected shared circuit with a signal line among the signal lines to be observed and that has a value determined therefor equal to the non-controlling value of the logical computation executed for the input signal input into the input terminal.

3. The circuit design support method according to claim 1, further comprising:
determining as a new circuit under-design, a circuit in which the selected shared circuit is connected to the circuit under-design, according to correlation indicated by the generated correlation information;
determining, among the signal lines to be observed and as new signal lines to be observed, a signal line from an output terminal of the selected shared circuit in the determined new circuit under-design and a signal line exclusive of the signal lines correlated based on the generated correlation information;
determining, for each of the new signal lines to be observed, a value based on the controllability;
selecting based on the obtained shared circuit information, a second shared circuit among the various types of shared circuits; and
generating second correlation information that correlates each input terminal of the selected second shared circuit with a signal line among the new signal lines to be observed and having a value determined therefor equal to the non-controlling value of the logical computation executed for the input signal that is input into the input terminal.

4. The circuit design support method according to claim 3, further comprising:
determining whether a signal line from an output terminal of an added shared circuit in the new circuit under-design propagates a signal propagated through shared circuits of a number greater than or equal to a predetermined stage number in the new circuit under-design; and
generating information indicating that the signal line from the output terminal of the selected shared circuit in the new circuit under-design is connected to an observation point at which a signal value is observable, when at the determining, the signal line from the output terminal is determined to propagate a signal propagated through shared circuits of a number greater than or equal to the predetermined stage number, wherein
the determining of the new signal lines to be observed includes determining the new signal lines to be observed such that the new signal lines to be observed do not include any signal line from the output terminal of the added shared circuit, when at the determining, the signal line from the output terminal is determined to propagate a signal propagated through shared circuits of a number greater than or equal to the predetermined stage number.

5. The circuit design support method according to claim 1, further comprising
selecting a signal line among the signal lines to be observed, wherein
the selecting of the shared circuit includes selecting from the various types of shared circuits and based on the obtained shared circuit information, a shared circuit that executes logical computation having a non-controlling value that is equal to the value determined for the selected signal line, and
the generating of the correlation information includes generating the correlation information that correlates each input terminal of the selected shared circuit with a signal line that is among the signal lines to be observed and having a value determined therefor equal to the non-controlling value of the logical computation executed for the input signal input into the input terminal, and that correlates the selected signal line with any one input terminal among the input terminals of the selected shared circuit.

6. The circuit design support method according to claim 5, wherein
the generating of the correlation information includes generating the correlation information by:
correlating the selected signal line with a given input terminal among the input terminals of the selected shared circuit and at which the non-controlling value of the logical computation executed for the input signal input thereto is equal to the value determined for the selected signal line; and
correlating each input terminal of the selected shared circuit exclusive of the given input terminal, with any one of the signal lines to be observed, exclusive the selected signal line, and having values determined therefor equal to the non-controlling value of the logical computation executed for the input signal input into the input terminal.

7. The circuit design support method according to claim 5, further comprising:
obtaining circuit information that indicates a connection relation among cells in the circuit under-design; and
detecting based on the obtained circuit information and for each signal line to be observed exclusive of the selected signal line, the number of modules that are in the circuit under-design and between a module that includes the signal line and is in the circuit under-design and a module that includes the selected signal line and is in the circuit under-design, wherein
the generating of the correlation information includes generating the correlation information by correlating each input terminal exclusive of the any one input terminal with any one of the signal lines exclusive of the selected signal line and for which the detected number of modules is less than or equal to a threshold value.

8. The circuit design support method according to claim 1, further comprising
selecting a signal line among the signal lines to be observed and having values determined therefor equal to a non-controlling value of logical computation executed by the selected shared circuit, wherein
the generating of the correlation information includes generating the correlation information that correlates each input terminal of the selected shared circuit with a signal line among the signal lines to be observed and having a value determined therefor equal to the non-controlling value of the logical computation executed for an input signal input into the input terminal, and that correlates the selected signal line with an input terminal among the input terminals of the selected shared circuit.

9. A non-transitory, computer-readable recording medium that stores a circuit design support program causing a computer to execute a process comprising:
obtaining shared circuit information indicating various types of shared circuits each executing at least any one of various types of logical computations to enable a plurality of signal lines to share an observation point at which a signal value is observable;
determining, for each of the signal lines to be observed in a circuit under-design, a value based on controllability representing ease of control to set a value of the signal line to be a specific value;
selecting any one shared circuit among the various types of shared circuits based on the obtained shared circuit information, the selecting including selecting any one shared circuit based on a sequence indicated by the obtained shared circuit information; and
generating correlation information that correlates each input terminal of the selected shared circuit with a signal line among the signal lines to be observed and that has a value determined therefor equal to a non-controlling value of a logical computation executed for an input signal input into the input terminal, and
wherein the shared circuit information indicates order of the various types of shared circuit based on an area and a number of input terminals of each of the various types of shared circuits.

10. A circuit design support apparatus, comprising a processor configured to:
obtain shared circuit information indicating various types of shared circuits each executing at least any one of various types of logical computations to enable a plurality of signal lines to share an observation point at which a signal value is observable;
determine, for each of the signal lines to be observed in a circuit under-design, a value based on controllability representing ease of control to set a value of the signal line to be a specific value;
select any one shared circuit among the various types of shared circuits based on the obtained shared circuit information, the selecting includes selecting any one shared circuit based on a sequence indicated by the obtained shared circuit information; and
generate correlation information that correlates each input terminal of the selected shared circuit with a signal line among the signal lines to be observed and that has a value determined therefor equal to a non-controlling value of a logical computation executed for an input signal input into the input terminal, and
wherein the shared circuit information indicates order of the various types of shared circuit based on an area and a number of input terminals of each of the various types of shared circuits.

* * * * *